(12) United States Patent
Kimura et al.

(10) Patent No.: US 11,057,024 B2
(45) Date of Patent: Jul. 6, 2021

(54) FLIP FLOP CIRCUIT AND DATA PROCESSING APPARATUS

(71) Applicant: ROHM Co., LTD., Kyoto (JP)

(72) Inventors: Hiromitsu Kimura, Kyoto (JP); Kazuya Ioki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/831,449

(22) Filed: Mar. 26, 2020

(65) Prior Publication Data
US 2020/0313661 A1    Oct. 1, 2020

(30) Foreign Application Priority Data

Mar. 29, 2019 (JP) .............................. JP2019-065957

(51) Int. Cl.
*H03K 3/037* (2006.01)
*G06F 1/12* (2006.01)

(52) U.S. Cl.
CPC ............. *H03K 3/0372* (2013.01); *G06F 1/12* (2013.01)

(58) Field of Classification Search
CPC ......... G06F 1/12; H03K 3/0372; H03K 3/012
See application file for complete search history.

(56) References Cited

U.S. PATENT DOCUMENTS

2008/0218233 A1* 9/2008 Yamamoto ......... H03K 3/35625
327/198
2014/0226395 A1* 8/2014 Vilangudipitchai ..... G11C 7/22
365/154

FOREIGN PATENT DOCUMENTS

JP        2008-219491 A    9/2008

* cited by examiner

*Primary Examiner* — Patrick C Chen
(74) *Attorney, Agent, or Firm* — Chip Law Group

(57) ABSTRACT

Disclosed is a flip flop circuit including a master latch circuit receiving master input data based on target input data, a slave latch circuit configured to load master output data from the master latch circuit and to hold the master output data, and a data output section, target output data based on the target input data being output from the data output section. The slave latch circuit includes a first to an N-th slave latch circuits provided in parallel with the master latch circuit (N is an integer of 2 or larger), the flip flop circuit further includes an output selection circuit selecting any one of data output from the first to N-th slave latch circuits, and selection data from the output selection circuit is output from the data output section as the target output data.

10 Claims, 13 Drawing Sheets

THROUGH STATE OF MASTER LATCH CIRCUIT

HOLD STATE OF MASTER LATCH CIRCUIT

THROUGH STATE OF SLAVE LATCH CIRCUIT

HOLD STATE OF SLAVE LATCH CIRCUIT

FLIP FLOP CIRCUIT AND DATA PROCESSING APPARATUS

CROSS REFERENCE TO RELATED APPLICATIONS

This US. application claims priority benefit of Japanese Patent Application No. 2019-065957 filed in the Japan Patent Office on Mar. 29, 2019. Each of the above-referenced applications is hereby incorporated herein by reference in its entirety.

BACKGROUND

The present disclosure relates to a flip flop circuit and a data processing circuit.

Various apparatuses handling data may desirably simultaneously implement a plurality of functions (for example, inter-integrated circuit (I2C) communication functions). In this case, in general, a plurality of circuits with the same configuration are provided and operated in parallel.

FIG. 7 illustrates a configuration diagram of a reference apparatus 900 with two circuits having the same configuration. The reference apparatus 900 includes a first and a second digital processing circuits 910 having the same configuration. Each of the digital processing circuits 910 includes a logic circuit 912 including a combinational circuit, a flip flop group 911 including a plurality of D-type flip flop circuits (hereinafter referred to as DFFs) inputting data to the logic circuit 912, and a flip flop group 913 including a plurality of DFFs receiving and holding output data from the logic circuit 912. Each of the DEFs included in the flip flop groups 911 and 913 operates in synchronization with a clock signal CLK'.

The reference apparatus 900 needs to execute, in parallel, first signal processing based on data for first processing and second signal processing based on data for second processing (in other words, the first signal processing and the second signal processing need to be executed simultaneously). The contents themselves of the first and second signal processing are common to the first and second signal processing. However, the two digital processing circuits 910 are provided due to a need for parallel execution. The data for the first processing is input to the first digital processing circuit 910 to cause the first digital processing circuit 910 to execute the first signal processing. The data for the second processing is input to the second digital processing circuit 910 to cause the second digital processing circuit 910 to execute the second signal processing. Note that general DEFs are of a master slave type including a mater latch circuit and a slave latch circuit (see, Japanese Patent Laid-Open No. 2008-219491, for example).

SUMMARY

The reference apparatus 900 in FIG. 7 needs to include two logic circuits 912 having a common configuration, leading to a corresponding increase in a circuit area. Provision of three or more logic circuits with a common configuration further increases the circuit area. It goes without saying that a reduced circuit area is beneficial.

It is desirable to provide a flip flop circuit contributing to a reduction in a circuit area in the entire apparatus including the flip flop circuit and a data processing apparatus contributing to a reduction in a circuit area.

According to an embodiment of the present disclosure, there is provided a flip flop circuit including a master latch circuit receiving master input data based on target input data, a slave latch circuit configured to load master output data from the master latch circuit and to hold the master output data, and a data output section. Target output data based on the target input data is output from the data output section. The slave latch circuit includes a first to an N-th slave latch circuits provided in parallel with the master latch circuit, N being an integer of 2 or larger, the flip flop circuit further includes an output selection circuit selecting any one of data output from the first to N-th slave latch circuits, and selection data from the output selection circuit is output from the data output section as the target output data (first configuration).

The flip flop circuit according to the first configuration may include a clock signal input section receiving an input of a clock signal including a rectangular wave signal, a clock selection signal input section receiving an input of a clock selection signal, an output selection signal input section receiving an input of an output selection signal, and a control signal generation circuit generating a first to an N-th control signals on a basis of the clock signal and the clock selection signal. The master latch circuit may operate in synchronization with the clock signal, an i-th slave circuit may operate in synchronization with an i-th control signal, i being an integer of 1 or larger and N or smaller, and the output selection circuit may select one of output data from the first to N-th slave latch circuits on a basis of the output selection signal (second configuration).

In the flip flop circuit according to the second configuration, on a basis of the clock selection signal, the control signal generation circuit may use any one of the first to N-th control signals as a specific control signal having a signal level varying in synchronization with the clock signal and fix, to a predetermined level, a level of non-specific control signals corresponding to other control signals (third configuration).

In the flip flop circuit according to the third configuration, the master latch circuit may load and hold the master input data in response to a predetermined level change in the clock signal and output the held data to each slave latch circuit as the master output data, a specific slave latch circuit included in the first to N-th slave latch circuits and corresponding to the specific control signal may load and hold the master output data in response to a predetermined level change in the specific control signal, non-specific slave latch circuits included in the first to N-th slave latch circuits and corresponding to the non-specific control signals may keep data held by the non-specific slave latch circuits unchanged, and each of the slave latch circuits may output the data held by the slave latch circuit to the output selection circuit (fourth configuration).

In the flip flop circuit according to the fourth configuration, the master latch circuit may include a master output circuit configured to output the master output data corresponding to the master input data and a master feedback circuit configured to feed back the master output data to an input side of the master output circuit, and take one of a master through state in which the master latch circuit generates the master output data on a basis of the master input data without feedback from the master feedback circuit and a master hold state in which the master latch circuit generates the master output data on a basis of feedback data from the master feedback circuit regardless of the master input data, each slave latch circuit may include a slave output circuit configured to receive slave input data based on the master output data and to output slave output data corresponding to the slave input data and a slave feedback circuit configured to feed back the slave output data to an input side of the slave output circuit, and take one of a slave through state in which the slave latch circuit generates the slave output data on a basis of the slave input data without feedback from the slave feedback circuit and a slave hold state in which the slave latch circuit generates the slave output data on a basis of feedback data from the slave feedback circuit regardless of the slave input data, the state of the master latch circuit may be switched between the master through state and the master hold state depending on a level of the clock signal, the state of the specific slave latch circuit may be switched between the slave through state and the slave hold state depending on a level of the specific control signal, and the state of the non-specific slave latch circuits may be fixed to the slave hold state on a basis of the non-specific control signals (fifth configuration).

The flip flop circuit according to the fifth configuration may further include a set signal input section receiving inputs of a first to an N-th set signals, the i-th slave latch circuit may generate, in the slave hold state, the slave output data of the i-th slave latch circuit with also reference to an i-th set signal, and the master latch circuit may generate, in each of the master through state and the master hold state, the master output data with also reference to the first to N-th set signals (sixth configuration).

The flip flop circuit according to the fifth or sixth configuration may further include a reset signal input section receiving inputs of a first to an N-th reset signals, the i-th slave latch circuit may generate, in each of the slave through state and the slave hold state, the slave output data of the i-th slave latch circuit with also reference to an i-th reset signal, and the master latch circuit may generate, in the master hold state, the master output data with also reference to the first to N-th reset signals (seventh configuration).

In the flip flop circuit according to any one of the first to seventh configurations, the target input data may include first and second target input data, and the flip flop circuit may further include an input selection circuit feeding one of the first and second target input data to the master latch circuit as the master input data (eighth configuration).

According to another embodiment of the present disclosure, there is provided a data processing apparatus including the flip flop circuit according to any one of the first and eighth configurations, a data input circuit feeding the target input data to the flip flop circuit, and a logic circuit operating on a basis of the target output data output from the data output section of the flip flop circuit (ninth configuration).

According to further embodiment of the present disclosure, there is provided a data processing apparatus including the flip flop circuit according to any one of the second to seventh configurations, a data input circuit feeding the target input data to the flip flop circuit, a control circuit feeding the clock selection signal and the output selection signal to the flip flop circuit, and a logic circuit operating on a basis of the target output data output from the data output section of the flip flop circuit (tenth configuration).

In the data processing apparatus according to the tenth configuration, the control circuit may feed the clock selection signal and the output selection signal to the flip flop circuit such that the master input data at different first to N-th timings are respectively loaded and held by the first to N-th slave latch circuits and that data held by the first to N-th slave latch circuits are output from the data output section at different timings (eleventh configuration).

According to the present disclosure, it is possible to provide a flip flop circuit contributing to a reduction in a circuit area in the entire apparatus including the flip flop circuit and a data processing apparatus contributing a reduction in a circuit area.

DETAILED DESCRIPTION OF THE PREFERRED EMBODIMENTS

Examples of embodiments of the present disclosure will be specifically described below with reference to the drawings. In the figures referred to, the same components are denoted by the same symbols, and duplicate descriptions of the same components are in principle omitted. Note that, in the specification, for simplification of description, symbols or signs referring to information, signals, physical quantities, elements, or regions may be provided, with the names of the information, signals, physical quantities, elements, regions, or the like omitted or simply represented. For example, an output selection signal described below and referred to as "SEL" (see FIG. 2) may be represented as the output selection signal SEL or simply represented as the signal SEL, but the output selection signal, the output selection signal SEL, and the signal SEL all refer to the same.

First, several terms used in the description of the embodiments of the present disclosure will be described. In the embodiments of the present disclosure, an IC is an abbreviation of an integrated circuit. "Level" refers to the level of a voltage, and for any signal or voltage, a high level has a higher potential than a low level. For any signal of interest, when the signal of interest is at the high level, an inversion signal of the signal of interest takes the low level. When the signal of interest is at the low level, the inversion signal of the signal of interest takes the high level. In any signal or voltage, switching from the low level to the high level is referred to as an up edge, and switching from the high level to the low level is referred to as a down edge.

First Embodiment

Figure 1:
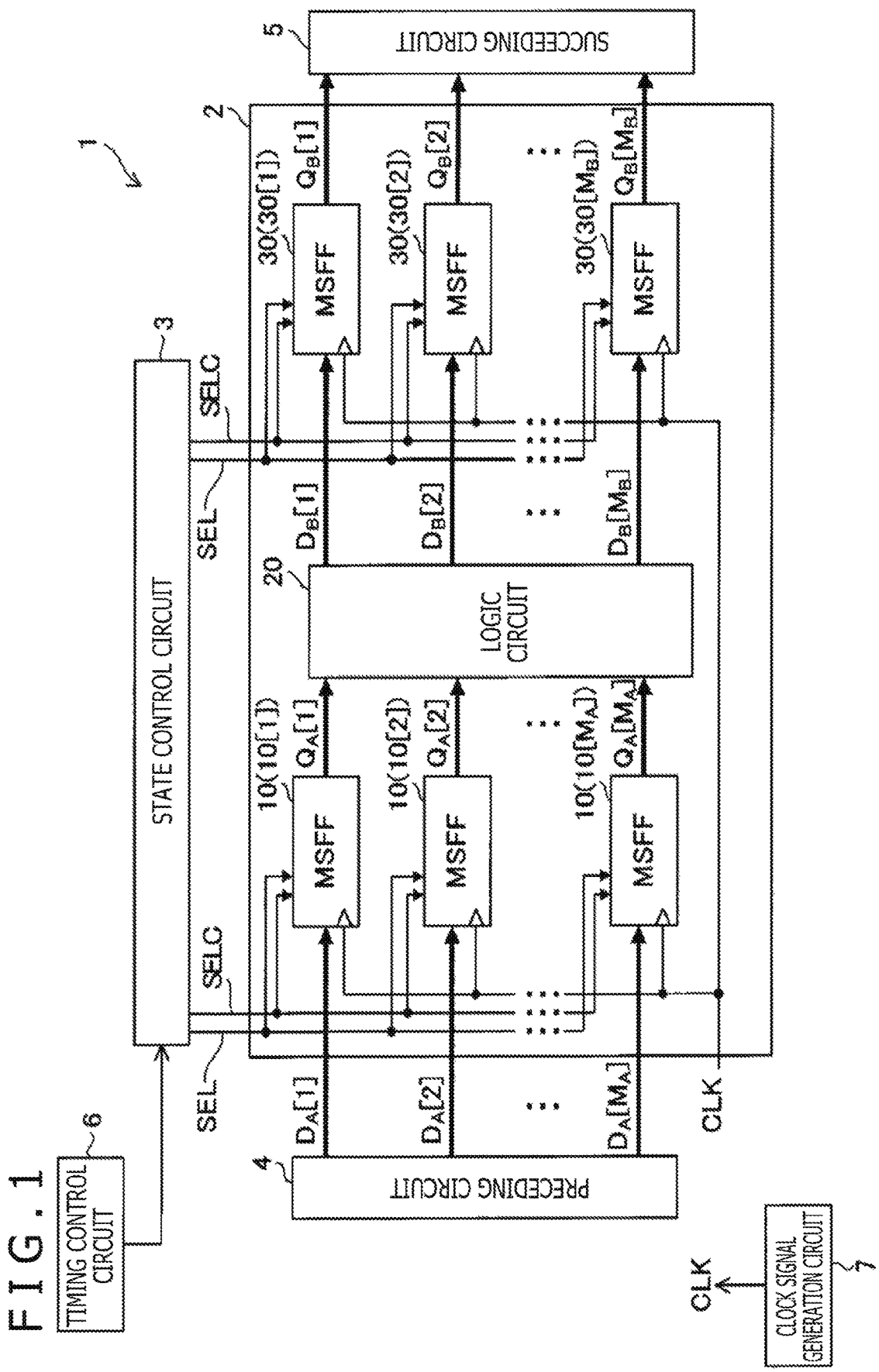
FIG. 1 is a configuration diagram of a data processing apparatus according to a first embodiment of the present disclosure.

A first embodiment of the present disclosure will be described. FIG. 1 is a configuration diagram of a data processing apparatus 1 according to the first embodiment of the present disclosure. The data processing apparatus 1 is configured as a semiconductor integrated circuit. The data processing apparatus 1 includes a digital processing circuit 2, a state control circuit 3, a preceding circuit 4, a succeeding circuit 5, a timing control circuit 6, and a clock signal generation circuit 7. Note that main components of the data processing apparatus 1 related to the embodiments of the present disclosure are focused on herein and that other components different from the components referred to by reference symbols 2 to 7 may also be included in the data processing apparatus 1, with illustration and description of the other components omitted.

The clock signal generation circuit 7 generates and outputs a clock signal CLK. The clock signal CLK is a rectangular wave signal having a predetermined frequency (for example, 2 MHz), and thus the signal level of the clock signal CLK periodically switches between the low level and the high level. The digital processing circuit 2 and the state control circuit 3 operate in synchronization with the clock signal CLK. The preceding circuit 4, the succeeding circuit 5, and the timing control circuit 6 may operate in synchronization with the clock signal CLK or a clock signal different from the clock signal CLK.

The preceding circuit 4 feeds data DA[1] to DA[MA] to the digital processing circuit 2. Here, MA denotes any integer of 2 or larger. The data DA[1] to DA[MA] are simultaneously input to the digital processing circuit 2 via MA wires provided between the preceding circuit 4 and the digital processing circuit 2.

The digital processing circuit 2 includes a plurality of flip flop circuits. The flip flop circuits provided in the digital processing circuit 2 are each a master-slave flip flop circuit including a master latch circuit and a slave latch circuit. However, each of the flip flop circuits provided in the digital processing circuit 2 includes a plurality of slave latch circuits. The flip flop circuit including a plurality of slave latch circuits is specifically referred to as a multi-slave flip flop circuit and is hereinafter represented as "MSFF." "MSFF" is an abbreviation of a "Multi-Slave Flip-Flop."

Specifically, the digital processing circuit 2 includes a logic circuit 20, MA MSFFs 10 preceding the logic circuit 20, and MB MSFFs 30 succeeding the logic circuit 20. MB is any integer of 2 or larger. MA and MB may have the same value or different values. In a case where the MA MSFFs 10 need to be distinguished from one another, the MA MSFFs 10 are referred to by "10[1] to 10[MA]." In a case where the MB MSFFs 30 need to be distinguished from one another, the MB MSFFs 30 are referred to by "30[1] to 30[MB]." The MSFFs 10[1] to 10[MA] and the MSFFs 30[1] to 30[MB] have the same configuration.

The digital processing circuit 2 executes predetermined signal processing (logical operation) on the data DA[1] to DA[MA] input and outputs data indicating the results of the signal processing.

Under timing control performed by the timing control circuit 6, the state control circuit 3 feeds an output selection signal SEL and a clock selection signal SELC to all the MSFFs 10 and 30 in the digital processing circuit 2.

Figure 2:
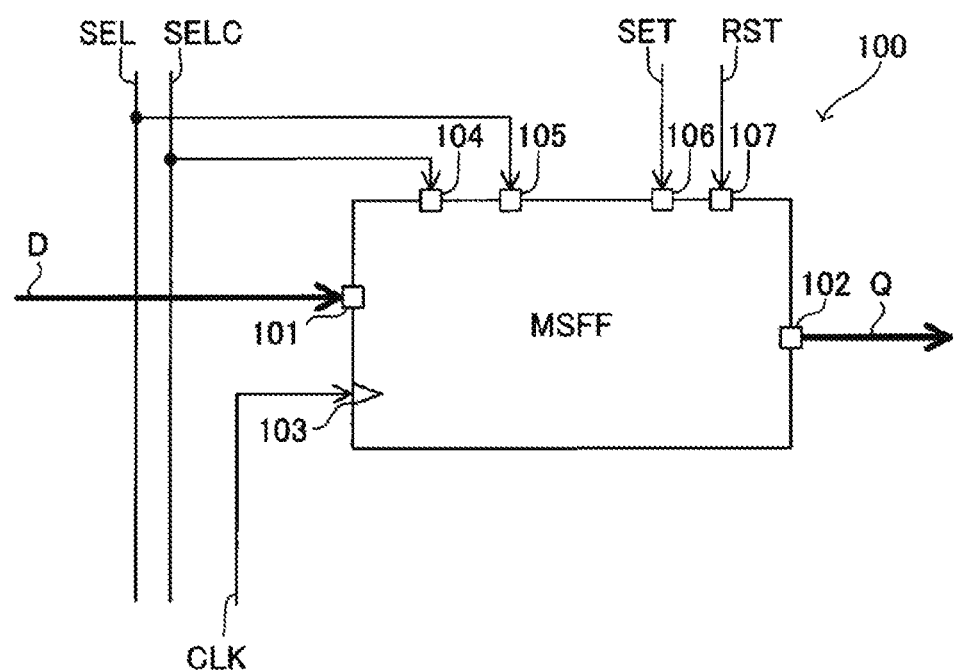
FIG. 2 is a configuration diagram related to input and output of data and signals to and from a multi-slave flip flop circuit according to the first embodiment of the present disclosure.

FIG. 2 illustrates a configuration related to input and output of data and signals to and from one MSFF 100. The MSFF 100 can be used as each of the MSFFs 10[1] to 10[MA] and the MSFFs 30[1] to 30[MB].

The MSFF 100 includes a data input section 101 receiving input data D from outside of the MSFF 100, a data output section 102 in which output data Q from the MSFF 100 appears, a clock signal input section 103 receiving an input of the clock signal CLK, a clock selection signal input section 104 receiving an input of the clock selection signal SELC, and a output selection signal input section 105 receiving an input of the output selection signal SEL. Furthermore, the MSFF 100 may be provided with a set signal input section 106 receiving an input of a set signal SET and a reset signal input section 107 receiving an input of a reset signal RST. In a case where the MSFF 100 is provided with the input sections 106 and 107, the set signal SET and the reset signal RST are fed from the state control circuit 3 or any other circuit to the MSFF 100. The MSFF 100 may not be provided with the input sections 106 and 107.

In the data processing apparatus 1 in FIG. 1, input data D to the MSFFs 10[1] to 10[MA] are respectively data DA[1] to DA[MA], and output data Q from the MSFFs 10[1] to 10[MA] are respectively data QA[1] to QA[MA]. In the data processing apparatus 1 in FIG. 1, input data D to the MSFFs 30[1] to 30[MB] are respectively data DB[1] to DB[MB], and output data Q from the MSFFs 30[1] to 30[MB] are data QB[1] to QB[MB]. Each of the data DA[1] to DA[MA], QA[1] to QA[MA], DB[1] to DB[MB], QB[1] to QB[MB] is 1-bit digital data.

The output data QA[1] to QA[MA] from the MSFFs 10[1] to 10[MA] are input to the logic circuit 20. The logic circuit 20 includes a combinational circuit and executes signal processing (logical operation) based on the output data QA[1] to QA[MA] and outputs the results of the signal processing as the data DB[1] to DB[MB]. The data DB[1] to DB[MB] from the logic circuit 20 are respectively input to the MSFFs 30[1] to 30[MB].

The output data QB[1] to QB[MB] from the MSFFs 30[1] to 30[MB] are fed to the succeeding circuit 5. The succeeding circuit 5 executes predetermined processing on the basis of the data fed to the succeeding circuit 5. Note that, in the digital processing circuit 2, another type of signal processing may further be executed on the output data QB[1] to QB[MB] from the MSFFs 30[1] to 30[MB] and that the resultant data may be fed to the succeeding circuit 5.

The first embodiment includes Examples EX1_1 to EX1_3 described below. In Examples EX1_1 to EX1_3, specific configuration examples and operation examples of the data processing apparatus 1 (particularly the MSFFs 10 and 30) will be described. Note that, in Examples EX1_1 to EX1_3, matters described in any embodiment can be applied to any other embodiment (that is, any two or more of the plurality of embodiments can be combined together).

Example EX1_1

Example EX1_1 will be described. In Example EX1_1, it is assumed that the input sections 106 and 107 in FIG. 2 are not provided in the MSFF 100.

Figure 3:
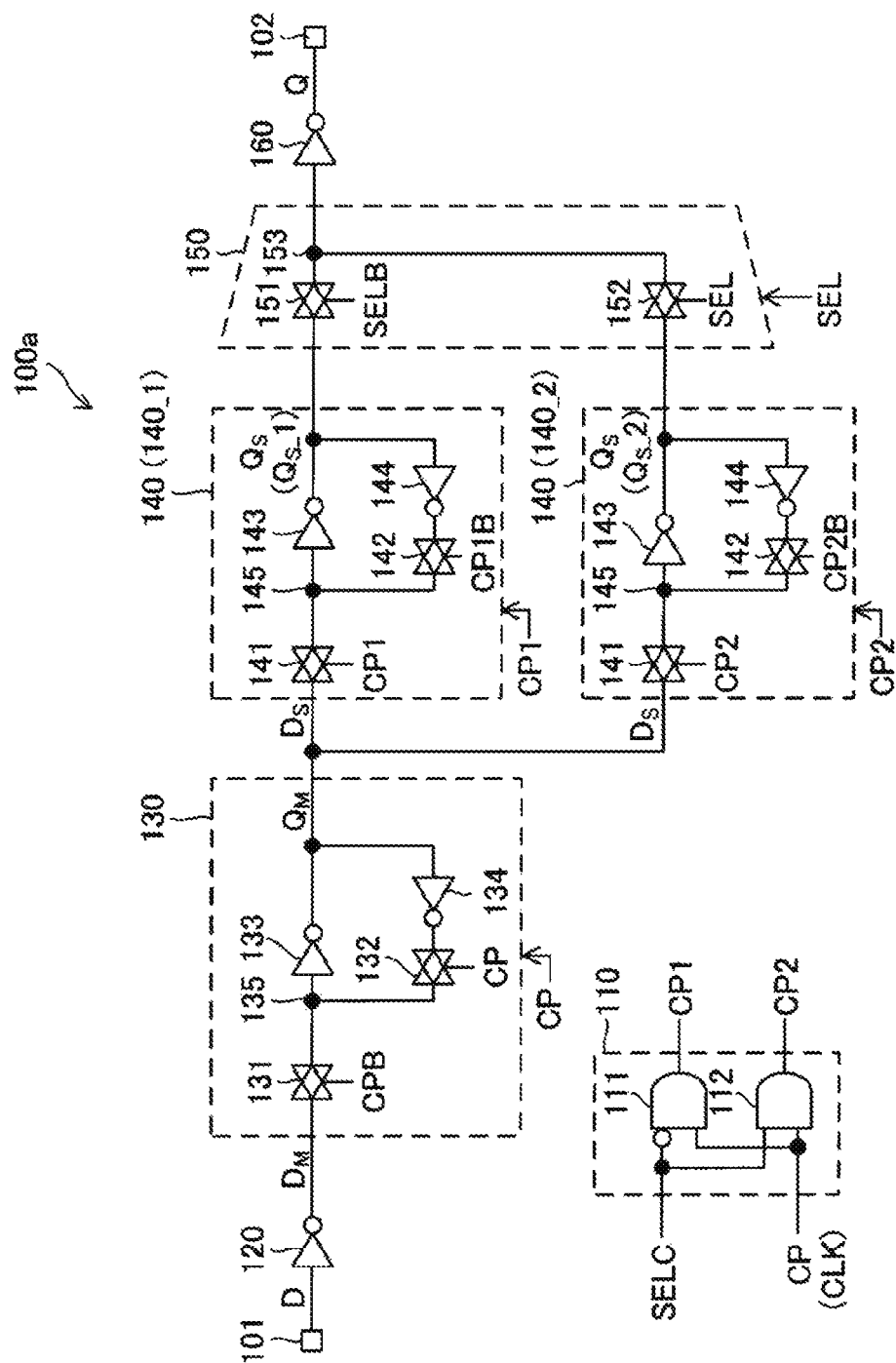
FIG. 3 is a circuit diagram of the multi-slave flip flop circuit according to Example EX1_1 belonging to the first embodiment of the present disclosure.

FIG. 3 is an internal configuration diagram of an MSFF 100a corresponding to the MSFF 100 according to Example EX1_1. The MSFF 100a includes a control signal generation circuit 110, an inverter circuit 120, a master latch circuit 130, two slave latch circuits 140, an output selection circuit 150, and an inverter circuit 160. The MSFF 100a is configured as what is called a master-slave flip flop circuit, and the two slave latch circuits 140 succeed the master latch circuit 130 in parallel with the master latch circuit 130. In a case where the two slave latch circuits 140 need to be distinguished from each other, one of the two slave latch circuits 140 is referred to by reference sign "140_1," and the other is referred to by reference sign "140_2."

A clock signal CP and the clock selection signal SELC are input to the control signal generation circuit 110. The clock signal CP is an internal clock signal referenced inside the MSFF 100. The clock signal CP is equivalent to the clock signal CLK and may be considered to refer to the same signal as the clock signal CLK. In Example EX1_1, the clock selection signal SELC is a 1-bit digital signal, and takes a high or low signal level.

The control signal generation circuit 110 generates control signals CP1 and CP2 on the basis of the signals CP and SELC. Specifically, the circuit 110 includes AND circuits 111 and 112. The AND circuit 111 outputs a logical product signal of the signal CP and an inversion signal of the signal SELC as the control signal CP1. The AND circuit 112 outputs a logical product signal of the signal CP and the signal SELC as the control signal CP2. Accordingly, when the clock selection signal SELC is at the low level, the control signal CP1 is equivalent to the clock signal CP, and the signal level of the control signal CP1 changes between the low level and the high level in synchronization with the clock signal CP, while the signal level of the control signal CP2 is fixed at the low level. In contrast, when the clock selection signal SELC is at the high level, the control signal CP2 is equivalent to the clock signal CP, and the signal level of the control signal CP2 changes between the low level and the high level in synchronization with the clock signal CP, while the signal level of the control signal CP1 is fixed at the low level.

In such a manner, either one of the control signals CP1 and CP2 is equivalent to the clock signal CP. The control signals CP1 and CP2 are respectively fed to the slave latch circuits 140_1 and 140_2. Accordingly, the clock selection signal SELC functions as a signal for selecting which of the slave latch circuits 140_1 and 140_2 is to be fed with the clock signal CP. The control signals CP1 and CP2 may be replaced with a first and a second clock signals, and in this case, the clock signals CLK and CP may be referred to as reference clock signals.

A signal indicating the input data D is input to an input end of the inverter circuit 120, and an inversion signal of a signal indicating the input data D is output from an output end of the inverter circuit 120. An output signal from the inverter circuit 120 (that is, the inversion signal of the signal indicating the input data D) functions as a signal indicating master input data DM. The signal indicating the master input data DM is fed to an input end of the master latch circuit 130, and a signal indicating a master output data QM corresponding to the master input data DM is output from an output end of the master latch circuit 130. The signal indicating the master output data QM is fed to an input end of each slave latch circuit 140 as a signal indicating the slave input data DS. Each slave latch circuit 140 generates slave output data QS corresponding to the slave input data DS and outputs, from an output end of the slave latch circuit 140, a signal indicating the slave output data QS. The output selection circuit 150 selects either one of the two slave output data QS from the two slave latch circuit 140 on the basis of the output selection signal SEL, and outputs a signal indicating the selected slave output data QS. The inverter circuit 160 generates, as a signal indicating the output data Q, an inversion signal of the signal indicating the slave output data QS selected and output by the output selection circuit 150. The signal indicating the output data Q is output from the data output section 102.

Each of the following signals is a 1-bit digital signal taking the low or high signal level: the signal indicating the input data D, the signal indicating the master input data DM, the signal indicating the master output data QM, the signal indicating the slave input data DS, the signal indicating the slave output data QS, and the signal indicating the output data Q.

Here, it is assumed that the input data D, the master output data QM, the slave input data DS, and the output data Q are defined using positive logic and that the master input data DM and the slave output data QS are defined using negative logic. Specifically, it is assumed that, when the signal level of a signal indicating data of interest corresponding to the data D, QM, DS, or Q is at the high level or the low level, the data of interest has a logical value of "1" or "0," respectively. In contrast, it is assumed that, when the signal level of a signal indicating data of interest corresponding to the data DM or QS is at the high level or the low level, the data of interest has a logical value of "0" or "1," respectively.

For any latch circuit or selection circuit, an input, to the circuit, of a signal indicating certain data is synonymous with an input of certain data to the circuit, and an output, from the circuit, of a signal indicating certain data is synonymous with an output of certain data from the circuit. Accordingly, for example, inputting, to the master latch circuit 130, of the signal indicating the master input data DM may be expressed as an input of the master input data DM to the master latch circuit 130 or outputting, from the master latch circuit 130, of the signal indicating the master output data QM may be expressed as an output of the master output data QM from the master latch circuit 130 (this also applies to other examples described below and other embodiments described below).

The master latch circuit 130 operates in synchronization with the clock signal CP and loads and holds (latches) the data DM in response to a predetermined level change in the clock signal CP. The data held by the master latch circuit 130 corresponds to the master output data QM. The slave latch circuit 140_1 operates in synchronization with the control signal CP1 and loads and holds (latches) the data DS matching the data QM in response to a predetermined level change in the control signal CP1. The slave latch circuit 140_2 operates in synchronization with the control signal CP2 and loads and holds (latches) the data DS matching the data QM in response to a predetermined level change in the control signal CP2.

Configurations and operations of the master latch circuit 130, the slave latch circuit 140, and the output selection circuit 150 will be described in detail.

The master latch circuit 130 includes switches 131 and 132 and inverter circuits 133 and 134. Optional switches including the switches 131 and 132 are analog switches used as bidirectional switches, and may be, for example, transmission gates configured using complementary metal-oxide-semiconductor (CMOS) field effect transistors. The optional switches including the switches 131 and 132 include a first end, a second end, and a control end, and the first end and the second end are brought into a conductive state or nonconductive state (interrupted state) depending on the signal level fed to the control end. The first end and the second end being in the conductive state is referred to as an on state. The first end and the second end being in the nonconductive state (interrupted state) is referred to as an off state. Here, it is assumed that each of the optional switches including the switches 131 and 132 is in the on state when the signal to the control end is at the high level, and is in the off state when the signal to the control end is at the low level.

The signal indicating the master input data DM is input from the inverter circuit 120 to the first end of the switch 131, and the second end of the switch 131 is connected to a node 135. An input end of the inverter circuit 133 is connected to the node 135. The inverter circuit 133 outputs, from an output end of the inverter circuit 133, an inversion signal of a signal applied to the input end of the inverter circuit 133. An output signal from the inverter circuit 133 corresponds to the signal indicating the master output data QM. The output end of the inverter circuit 133 is connected to an input end of the inverter circuit 134. The inverter circuit 134 outputs, from an output end of the inverter circuit 134, an inversion signal of a signal applied to the input end of the inverter circuit 134. Accordingly, the inversion signal of the signal indicating the master output data QM is output from the output end of the inverter circuit 134. The first end of the switch 132 is connected to the output end of the inverter circuit 134, and the second end of the switch 132 is connected to the node 135.

Figure 4A:
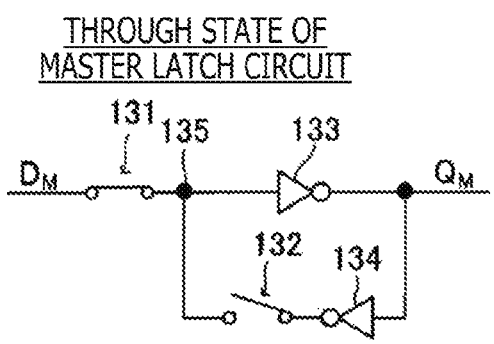
FIGS. 4A and 4B are conceptual diagrams of a through state and a hold state in a master latch circuit in FIG. 3.
Figure 4B:
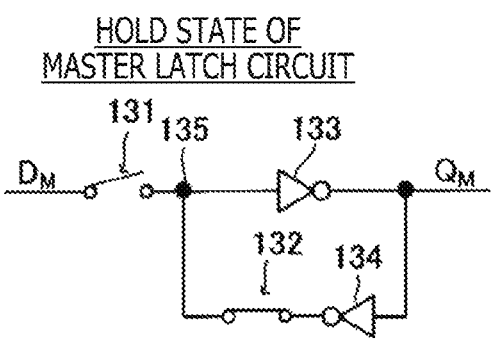

The clock signal CP is input to the control end of the switch 132, and an inversion signal CPB of the clock signal CP is input to the control end of the switch 131. Thus, when the clock signal CP is at the low level, the switch 131 is in the on state and the switch 132 is in the off state, and thus the master latch circuit 130 is in the through state (master through state). When the clock signal CP is at the high level, the switch 131 is in the off state and the switch 132 is in the on state, and thus the master latch circuit 130 is in the hold state (master hold state). FIGS. 4A and 4B schematically illustrates the through state and the hold state of the master latch circuit 130.

The master latch circuit 130 can be considered to include a master output circuit that can output the master output data QM corresponding to the master input data DM and a master feedback circuit that can feed back the master output data QM to the input side of the master output circuit. In the master latch circuit 130 in FIG. 3, the master output circuit includes the inverter circuit 133 or the switch 131 and the inverter circuit 133, and the master feedback circuit includes the inverter circuit 134 or the switch 132 and the inverter circuit 134. Feedback from the master feedback circuit means feeding, to the node 135, of an output signal from the inverter circuit 134 based on the master output data QM.

In the through state (master through state), the master latch circuit 130 generates the current master output data QM (output data from the inverter circuit 133) on the basis of the current master input data DM without feedback from the master feedback circuit. In other words, in the master latch circuit 130, the master input data DM itself is used as the master output data QM in the through state (master through state).

In the hold state (master hold state), the master latch circuit 130 generates the current master output data QM on the basis of feedback data from the master feedback circuit (output data from the inverter circuit 134) regardless of the current master input data DM. Specifically, in the hold state (master hold state), the master latch circuit 130 generates the current master output data QM on the basis of past master output data QM latched by the master feedback circuit.

The slave latch circuits 140_1 and 140_2 corresponding to two slave latch circuits 140 have the same configuration, and each slave latch circuit 140 includes switches 141 and 142 and inverter circuits 143 and 144. In each of the slave latch circuits 140_1 and 140_2, the signal indicating the master output data QM from the master latch circuit 130 is input to a first end of the switch 141 as the signal indicating the slave input data DS.

In each slave latch circuit 140, a second end of the switch 141 is connected to the node 145, and an input end of the inverter circuit 143 is connected to the node 145. The inverter circuit 143 outputs, from an output end of the inverter circuit 143, an inversion signal of the signal applied to the input end of the inverter circuit 143. An output signal from the inverter circuit 143 corresponds to the signal indicating the slave output data QS. In each slave latch circuit 140, the output end of the inverter circuit is connected to an input end of the inverter circuit 144. The inverter circuit 144 outputs, from an output end of the inverter circuit 144, an inversion signal of the signal applied to the input end of the inverter circuit 144. Accordingly, in each slave latch circuit 140, the inversion signal of the signal indicating the slave output data QS is output from the output end of the inverter circuit 144. In each slave latch circuit 140, a first end of the switch 142 is connected to the output end of the inverter circuit 144, and a second end of the switch 142 is connected to the node 145.

In each slave latch circuit 140, the control signal is input to a control end of the switch 141, and an inversion signal of the control signal is input to a control end of the switch 142. In this case, the control signal in the slave latch circuit 140_1 is the control signal CP1, and the control signal in the slave latch circuit 140_2 is the control signal CP2. Accordingly, in the slave latch circuit 140_1, the control signal CP1 is input to the control end of the switch 141, and an inversion signal CP1B of the control signal CP1 is input to the control end of the switch 142. In the slave latch circuit 140_2, the control signal CP2 is input to the control end of the switch 141, and an inversion signal CP2B of the control signal CP2 is input to the control end of the switch 142.

Thus, when the control signal CP1 is at the high level, in the slave latch circuit 140_1, the switch 141 is in the on state and the switch 142 is in the off state, and thus the slave latch circuit 140_1 is in the through state (slave through state). When the control signal CP1 is at the low level, in the slave latch circuit 140_1, the switch 141 is in the off state and the switch 142 is in the on state, and thus the slave latch circuit 140_1 is in the hold state (slave hold state).

Similarly, when the control signal CP2 is at the high level, in the slave latch circuit 140_2, the switch 141 is in the on state and the switch 142 is in the off state, and thus the slave latch circuit 140_2 is in the through state (slave through state). When the control signal CP2 is at the low level, in the slave latch circuit 140_2, the switch 141 is in the off state and the switch 142 is in the on state, and thus the slave latch circuit 140_2 is in the hold state (slave hold state).

Figure 5A:
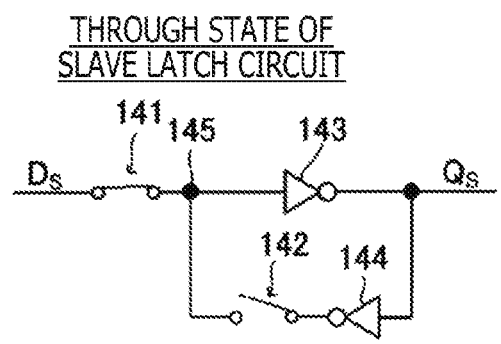
FIGS. 5A and 5B are conceptual diagrams of a through state and a hold state in a slave latch circuit in FIG. 3.
Figure 5B:
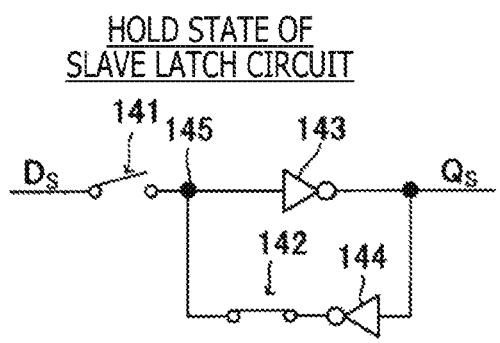

FIGS. 5A and 5B schematically illustrate the through state and hold state of one slave latch circuit 140.

Each of the slave latch circuits 140_1 and 140_2 can be considered to include a slave output circuit that can output the slave output data QS corresponding to the slave input data DS and a slave feedback circuit that can feed back the slave output data QS to the input side of the slave output circuit. In each slave latch circuit 140 in FIG. 3, the slave output circuit includes the inverter circuit 143 or the switch 141 and the inverter circuit 143, and the slave feedback circuit includes the inverter circuit 144 or the switch 142 and the inverter circuit 144. Feedback from the slave feedback circuit means feeding, to the node 145, of an output signal from the inverter circuit 144 based on the slave output data QS.

In the through state (slave through state), each slave latch circuit 140 generates the current slave output data QS (output data from the inverter circuit 143) on the basis of the current slave input data DS without feedback from the slave feedback circuit. Specifically, in each slave latch circuit 140, in the through state (slave through state), the slave input data DS itself is used as the slave output data QS.

In the hold state (slave hold state), each slave latch circuit 140 generates the current slave output data QS on the basis of feedback data from the slave feedback circuit (output data from the inverter circuit 144) regardless of the current slave input data DS. Specifically, in the hold state (slave hold state), each slave latch circuit 140 generates the current slave output data QS on the basis of past slave output data QS latched by the slave feedback circuit.

One of the control signals CP1 and CP2 that has a signal level changing in synchronization with the clock signal CP can be referred to as a specific control signal. The other control signal fixed to a predetermined signal level (in this case, the low level) can be referred to as a non-specific control signal. The control signal generation circuit 110 can be considered as a circuit using either one of the control signals CP1 and CP2 as the specific control signal while using the other as the non-specific control signal on the basis of the clock selection signal SELC.

The state of the master latch circuit 130 is switched between the through state and the hold state depending on the level of the clock signal CP. When the clock signal CP is at the low level, the master input data DM is loaded into the master latch circuit 130, and the loaded data is latched (held) by the master latch circuit 130 in synchronization with an up edge of the clock signal CP.

Similarly, the state of the slave latch circuit 140 corresponding to the specific control signal (hereinafter referred to as the specific slave latch circuit) is switched between the through state and the hold state depending on the level of the specific control signal. When the specific control signal is at the high level, the master output data QM is loaded into the specific slave latch circuit as the slave input data DS, and the loaded data is latched (held) by the specific slave latch circuit in synchronization with a down edge of the specific control signal.

In contrast, the slave latch circuit 140 corresponding to the non-specific control signal (hereinafter referred to as the non-specific slave latch circuit) is fixed to the hold state on the basis of the non-specific control signal. The non-specific slave latch circuit does not load the master output data QM, and the data latched (held) by the non-specific slave latch circuit remains unchanged.

The slave output data QS held and output by the slave latch circuits 140_1 and 140_2 are respectively referred to by symbols "QS_1" and "QS_2."

The output selection circuit 150 includes switches 151 and 152. A first end of the switch 151 is connected to the output end of the slave latch circuit 140_1, and a first end of the switch 152 is connected to the output end of the slave latch circuit 140_2. Accordingly, the signal indicating the slave output data QS_1 from the slave latch circuit 140_1 is input to the first end of the switch 151, and the signal indicating the slave output data QS_2 from the slave latch circuit 140_2 is input to the first end of the switch 152. Second ends of the switches 151 and 152 are connected in common to a node 153 corresponding to an output end of the output selection circuit 150. The output end of the output selection circuit 150 (that is, the node 153) is connected to an input end of the inverter circuit 160.

In Example EX1_1, the output selection signal SEL is a 1-bit digital signal and takes the high or low signal level. The output selection circuit 150 selects either one of the slave output data QS_1 and QS_2 on the basis of the output selection signal SEL. The selected data is output from the data output section 102 through the inverter circuit 160 as the output data Q.

The output selection signal SEL is input to a control end of the switch 152, and an inversion signal SELB of the output selection signal SEL is input to a control end of the switch 151. Thus, when the output selection signal SEL is at the low level, the switch 151 is in the on state and the switch 152 is in the off state, and thus the slave output data QS_1 is selected by the output selection circuit 150. As a result, an inversion signal of the signal indicating the slave output data QS_1 is output from an output end of the inverter circuit 160 (in other words, the slave output data QS_1 corresponds to the output data Q). On the other hand, when the output selection signal SEL is at the high level, the switch 151 is in the off state and the switch 152 is in the on state, and thus the slave output data QS_2 is selected by the output selection circuit 150. As a result, an inversion signal of the signal indicating the slave output data QS_2 is output from an output end of the inverter circuit 160 (in other words, the slave output data QS_2 corresponds to the output data Q).

Figure 6:
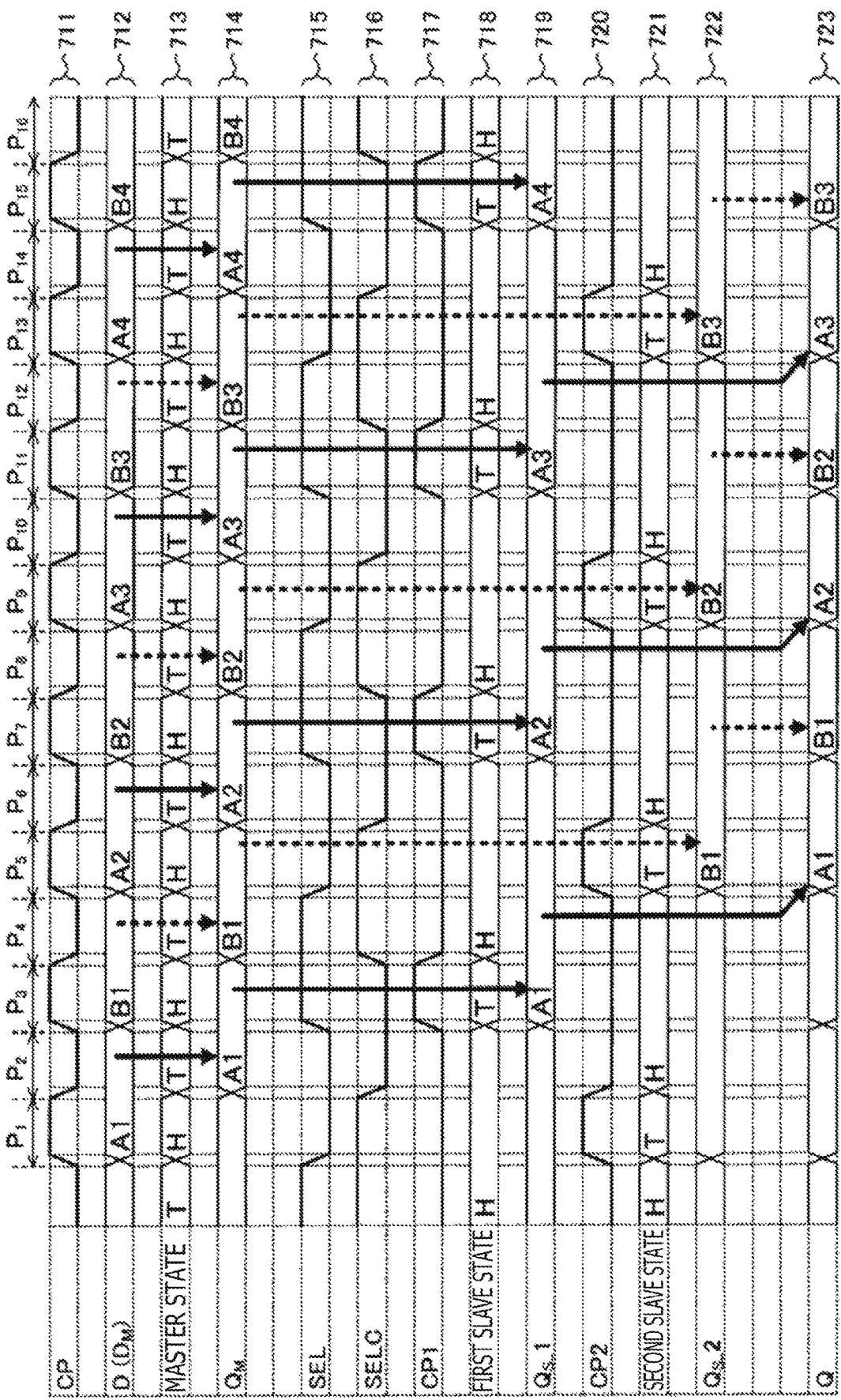
FIG. 6 is a timing chart of the multi-slave flip flop circuit according to Example EX1_1 belonging to the first embodiment of the present disclosure.

FIG. 6 is a timing chart illustrating an operation example of the MSFF 100*a*. FIG. 6 illustrates, at regions 711 to 723 arranged in an up-down direction, respectively, time series variations in the clock signal CP, the input data D (in other words, the master input data DM), a master state corresponding to the state of the master latch circuit 130, the master output data QM, the output selection signal SEL, the clock selection signal SELC, the control signal CP1, a first slave state corresponding to the state of the slave latch circuit 140_1, the slave output data QS_1, the control signal CP2, a second slave state corresponding to the state of the slave latch circuit 140_2, the slave output data QS_2, and the output data Q.

Note that, in FIG. 6, the through state in the master state, the first slave state, or the second slave state is expressed by a symbol "T" and that the hold state in the master state, the first slave state, or the second slave state is expressed by a symbol "H." In FIG. 6, each of A1 to A4 and B1 to B4 represents input/output (I/O) data or internal data in the MSFF 100*a*. The data A1 to A4 represent data to be latched sequentially by the slave latch circuit 140_1, and the data B1 to B4 represent data to be latched sequentially by the slave latch circuit 140_2.

For specific description, the timing chart in FIG. 6 will be described with intervals P1 to P16 focused on. Each of the intervals P1 to P16 has a length that is half the period of the clock signal CP. For any integer i, an interval Pi+1 is later than an interval Pi by half the period of the clock signal CP. During the interval Pi where the integer i is an odd number, an up edge of the clock signal CP occurs immediately after a start timing for the interval Pi, and the signal level of the clock signal CP is subsequently high. Accordingly, during the interval Pi where the integer i is an odd number, the master state is the hold state. During the interval Pi where the integer i is an even number, a down edge of the clock signal CP occurs immediately after the start timing for the interval Pi, and the clock signal CP subsequently has the low signal level. Accordingly, during the interval Pi where the integer i is an even number, the master state is the through state.

Data A1, B1, A2, B2, A3, B3, A4, and B4 respectively correspond to the input data D during intervals P1 and P2, the input data D during intervals P3 and P4, the input data D during intervals P5 and P6, the input data D during intervals P7 and P8, the input data D during intervals P9 and P10, the input data D during intervals P11 and P12, the input data D during intervals P13 and P14, and the input data D during intervals P15 and P16. Then, during one period of the clock signal CP starting at the up edge of the clock signal CP, the master state is the hold state during the former half (for example, P1) and is the through state during the latter half (for example, P2). Accordingly, the master output data QM corresponds to the data A1 during the intervals P2 and P3, to the data B1 during the intervals P4 and P5, to the data A2 during the intervals P6 and P7, to the data B2 during the intervals P8 and P9, to the data A3 during the intervals P10 and P11, to the data B3 during the intervals P12 and P13, to the data A4 during the intervals P14 and P15, and to the data B4 during the interval P16.

In the operation example in FIG. 6, the clock selection signal SELC is a rectangular wave signal having a period that is double the period of the clock signal CP. Additionally, a down edge occurs in the clock selection signal SELC at the start timing of the interval P2. Accordingly, the signal level of the clock selection signal SELC is low during the intervals when the master output data QM corresponds to the data A1, A2, A3, or A4 (that is, the intervals P2, P3, P6, P7, P10, P11, P14, and P15) and is high during the intervals when the master output data QM corresponds to the data B1, B2, B3, or B4 (that is, the intervals P4, P5, P8, P9, P12, P13, and P16).

In the operation example in FIG. 6, in a case where only the intervals P1 to P16 are focused on, the control signal CP1 is at the high level only during the intervals P3, P7, P11, and P15 and at the low level during the other intervals, on the basis of the clock signal CP and the clock selection signal SELC. Accordingly, in a case where only the intervals P1 to P16 are focused on, the first slave state is the through state only during the intervals P3, P7, P11, and P15 and is the hold state during the other intervals. As a result, during the interval P3, the data A1 used as the master output data QM is transmitted to and latched in the slave latch circuit 140_1, and the slave output data QS_1 during the interval P3 to P6 corresponds to the data A1. Similarly, during the interval P7, the data A2 used as the master output data QM is transmitted to and latched in the slave latch circuit 140_1, and the slave output data QS_1 during the interval P7 to P10 corresponds to the data A2. Similarly, the slave output data QS_1 during the intervals P11 to P14 corresponds to the data A3, and the slave output data QS_1 corresponds to the data A4 during an interval starting at the interval P15 and spanning two periods of the clock signal CP.

In the operation example in FIG. 6, in a case where only the intervals P1 to P16 are focused on, the control signal CP2 is at the high level only during the intervals P1, P5, P9, and P13 and at the low level during the other intervals, on the basis of the clock signal CP and the clock selection signal SELC. Accordingly, in a case where only the intervals P1 to P16 are focused on, the second slave state is the through state only during the intervals P1, P5, P9, and P13 and is the hold state during the other intervals. As a result, during the interval P5, the data B1 used as the master output data QM is transmitted to and latched in the slave latch circuit 140_2, and the slave output data QS_2 during the interval P5 to P8 corresponds to the data B1. Similarly, during the interval P9, the data B2 used as the master output data QM is transmitted to and latched in the slave latch circuit 140_2, and the slave output data QS_2 during the interval P9 to P12 corresponds to the data B2. Similarly, the slave output data QS_2 during the intervals P13 to P16 corresponds to the data B3. Although not illustrated in FIG. 6, the slave output data QS_2 corresponds to the data B4 during an interval starting immediately after the interval P16 and spanning two periods of the clock signal CP.

In the operation example in FIG. 6, like the clock selection signal SELC, the output selection signal SEL is a rectangular wave signal having a period that is double the period of the clock signal CP. However, a down edge occurs in the output selection signal SEL at the start timing of the interval P1. Accordingly, the output selection signal SEL is at the low level during the intervals P1, P2, P5, P6, P9, P10, P13, and P14, and at the high level during the intervals P3, P4, P7, P8, P11, P12, P15, and P16.

The output selection circuit 150 selects the slave output data QS_1 when the output selection signal SEL is at the low level and selects the slave output data QS_2 when the output selection signal SEL is at the high level (see FIG. 3). Thus, the output data Q corresponds to the data A1 during the intervals P5 and P6, to the data B1 during the intervals P7 and P8, to the data A2 during the intervals P9 and P10, to the data B2 during the intervals P11 and P12, to the data A3 during the intervals P13 and P14, and to the data B3 during the intervals P15 and P16.

As described above, in the MSFF 100a, the master input data DM at the first timing (in this case, the master input data DM matches the input data D) is loaded into and held by the slave latch circuit 140_1, and the master input data DM at the second timing (in this case, the master input data DM matches the input data D) is loaded into and held by the slave latch circuit 140_2. To implement this operation, the state control circuit 3 feeds the clock selection signal SELC to the MSFF 100a. The first and second timings are different from each other. Specifically, the first timing corresponds to a timing when the master input data DM corresponds to the data A1, A2, A3, or A4, and the second timing corresponds to a timing when the master input data DM corresponds to the data B1, B2, B3, or B4. The state control circuit 3 controls the level of the output selection signal SEL to the MSFF 100a to cause the data held in the slave latch circuit 140_1 and the data held in the slave latch circuit 140_2 (for example, data A1 and data B1) to be output from the data output section 102 at different timings as the output data Q.

As understood from the above description, in the MSFF 100a, the single master latch circuit 130 is used for the two slave latch circuits 140. During certain intervals, the master latch circuit 130 is caused to function as a master latch circuit for the slave latch circuit 140_1. This causes the MSFF 100a to operate as a master-slave first flip flop circuit including the master latch circuit 130 and the slave latch circuit 140_1. During different intervals, the master latch circuit 130 is caused to function as a master latch circuit for the slave latch circuit 140_2. This causes the MSFF 100a to operate as a master-slave second flip flop circuit including the master latch circuit 130 and the slave latch circuit 140_2.

Using the MSFF 100a described above allows the logic circuit 20 in FIG. 1 to execute, in parallel, first signal processing based on data for first processing and second signal processing based on data for second processing. The data for the first processing refers to one of the data A1 to A4 or is a generic term for the data A1 to A4. The data for the second processing refers to one of the data B1 to B4 or is a generic term for the data B1 to B4. The data for the first processing (A1 to A4) and the data for the second processing (B1 to B4) are different from each other. However, the values of these data may accidentally be equal to each other.

In a case where the operation example in FIG. 6 is applied to each MSFF 10 in FIG. 1 configured as the MSFF 100a, the data A1 to A4 and B1 to B4 are I/O data transmitted to and from each MSFF 10. The data A1 to A4 correspond to the data for the first processing, which is a part of the I/O data transmitted to and from the MSFF 10, and the data B1 to B4 correspond to the data for the second processing, which is a part of the I/O data transmitted to and from the MSFF 10.

During intervals when each MSFF 10 inputs the data for the first processing (A1 to A4) to the logic circuit 20, the logic circuit 20 executes the first signal processing based on the data for the first processing and outputs data indicating the results of the first signal processing (hereinafter referred to as the first signal processing result data) to each MSFF 30. During intervals when each MSFF 10 inputs the data for the second processing (B1 to B4) to the logic circuit 20, the logic circuit 20 executes the second signal processing based on the data for the second processing and outputs data indicating the results of the second signal processing (hereinafter referred to as the second signal processing result data) to each MSFF 30.

In a case where the operation example in FIG. 6 is applied to each MSFF 30 in FIG. 1 configured as the MSFF 100a, the data A1 to A4 and B1 to B4 are I/O data transmitted to and from each MSFF 30. The data A1 to A4 correspond to the data for the first processing, which is a part of the I/O data transmitted to and from the MSFF 30, and the data B1 to B4 correspond to the data for the second processing, which is a part of the I/O data transmitted to and from the MSFF 30. During intervals when each MSFF 30 feeds the first signal processing result data to a succeeding circuit 50, the succeeding circuit 50 can execute predetermined processing based on the first signal processing result data. During intervals when each MSFF 30 feeds the second signal processing result data to the succeeding circuit 50, the succeeding circuit 50 can execute predetermined processing based on the second signal processing result data.

Figure 7:
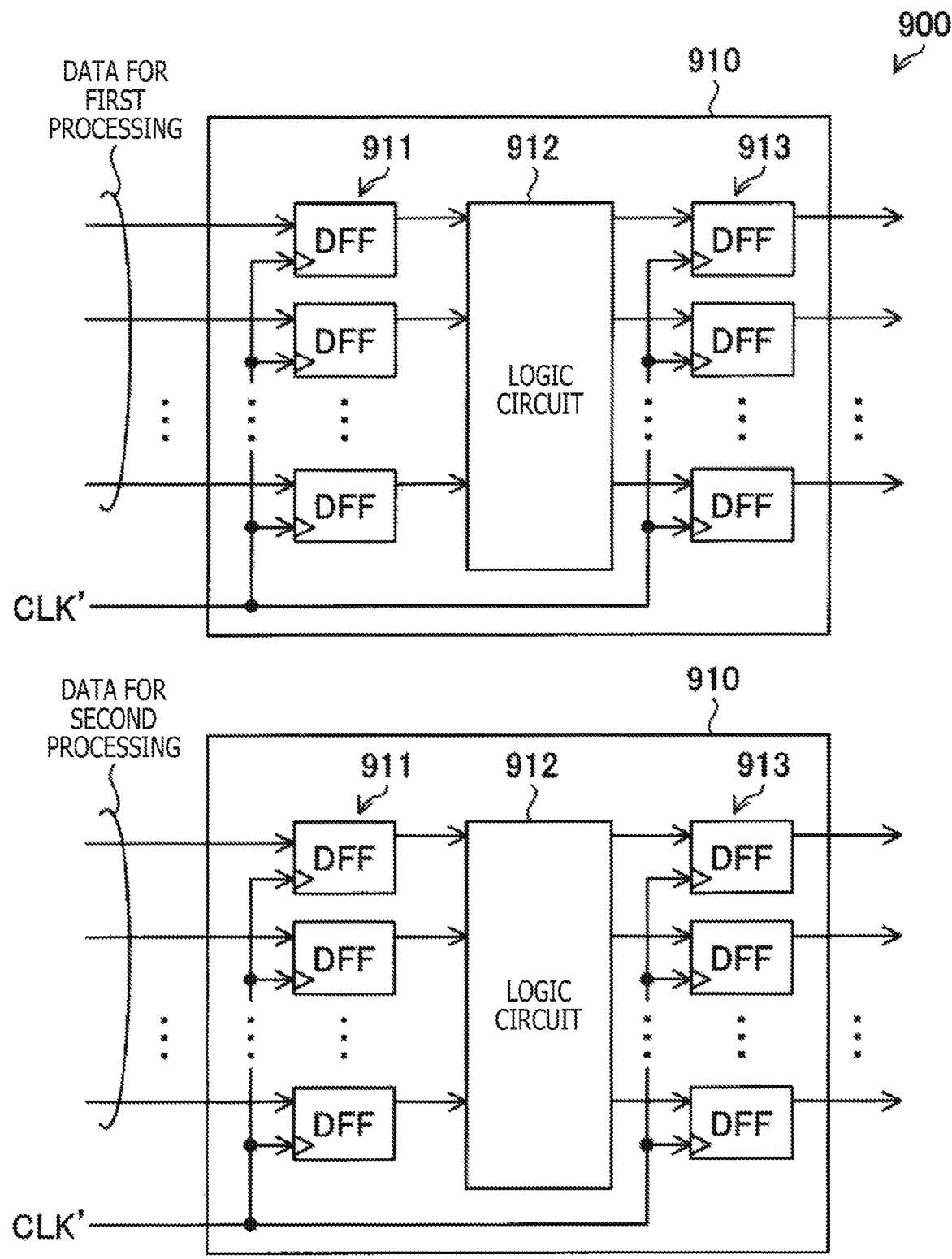
FIG. 7 is a configuration diagram of a reference apparatus.

Technical benefits according to the present embodiment will be described with reference back to FIG. 7. As described above, the reference apparatus 900 needs to execute, in parallel, the first signal processing based on the data for the first processing and the second signal processing based on the data for the second processing (in other words, the reference apparatus 900 needs to simultaneously execute the first signal processing and the second signal processing). The contents themselves of the first and second signal processing are common to the first and second signal processing, but two digital processing circuits 910 are provided due to the need for parallel execution. The data for the first processing is input to the first digital processing circuit 910 to cause the first digital processing circuit 910 to execute the first signal processing. The data for the second processing is input to the second digital processing circuit 910 to cause the second digital processing circuit 910 to execute the second signal processing. Thus, the reference apparatus 900 in FIG. 7 needs to include two logic circuits 912, leading to a corresponding increase in a circuit area.

In contrast, by configuring the data processing apparatus 1 (see FIG. 1) utilizing the MSFF 100a according to Example EX1_1, the single logic circuit 20 can be caused to execute the first signal processing based on the data for the first processing and the second signal processing based on the data for the second processing, and the results of the first and second signal processing can be acquired through the corresponding MSFFs 30. Thus, this configuration enables a reduction in a circuit area, compared to the reference apparatus 900.

However, compared to the reference apparatus 900, the data processing apparatus 1 using the MSFF 100a according to Example EX1_1 needs to double the frequency of the clock signal. For example, it is assumed that the reference apparatus 900 in FIG. 7, a clock signal CLK' to each of the digital processing circuits 910 has a frequency of 100 kHz. In this case, for the data processing apparatus 1 including the MSFF 100a to execute the first and second signal processing at a speed similar to the speed in the reference apparatus 900 to obtain the first and second signal processing result data, the clock signal CLK for the data processing apparatus 1 needs to have a frequency of 200 kHz. This is because, by setting the frequency of the clock signal CLK for the data processing apparatus 1 to 200 kHz, the data A1 to A4 can be obtained as the output data Q at intervals of the reciprocal of 100 kHz and the data B1 to B4 can be obtained as the output data Q at intervals of the reciprocal of 100 kHz.

It is assumed that each type of signal processing in the reference apparatus 900 and each type of signal processing in the data processing apparatus 1 are processing (communication processing) for performing communication (for example, I2C communication). In this case, the first signal processing and the second signal processing can be replaced with first communication processing and second communication processing. It is assumed that, both in the reference apparatus 900 and the data processing apparatus 1, a communication speed based on each type of communication processing needs to be equivalent to 100 kHz. It is assumed that the first communication processing and second communication processing need to be executed in parallel. It is assumed that each of the first communication processing and the second communication processing needs to be executed continuously at a communication speed equivalent to 100 kHz for a needed time (for example, 10 milliseconds).

Figure 8:
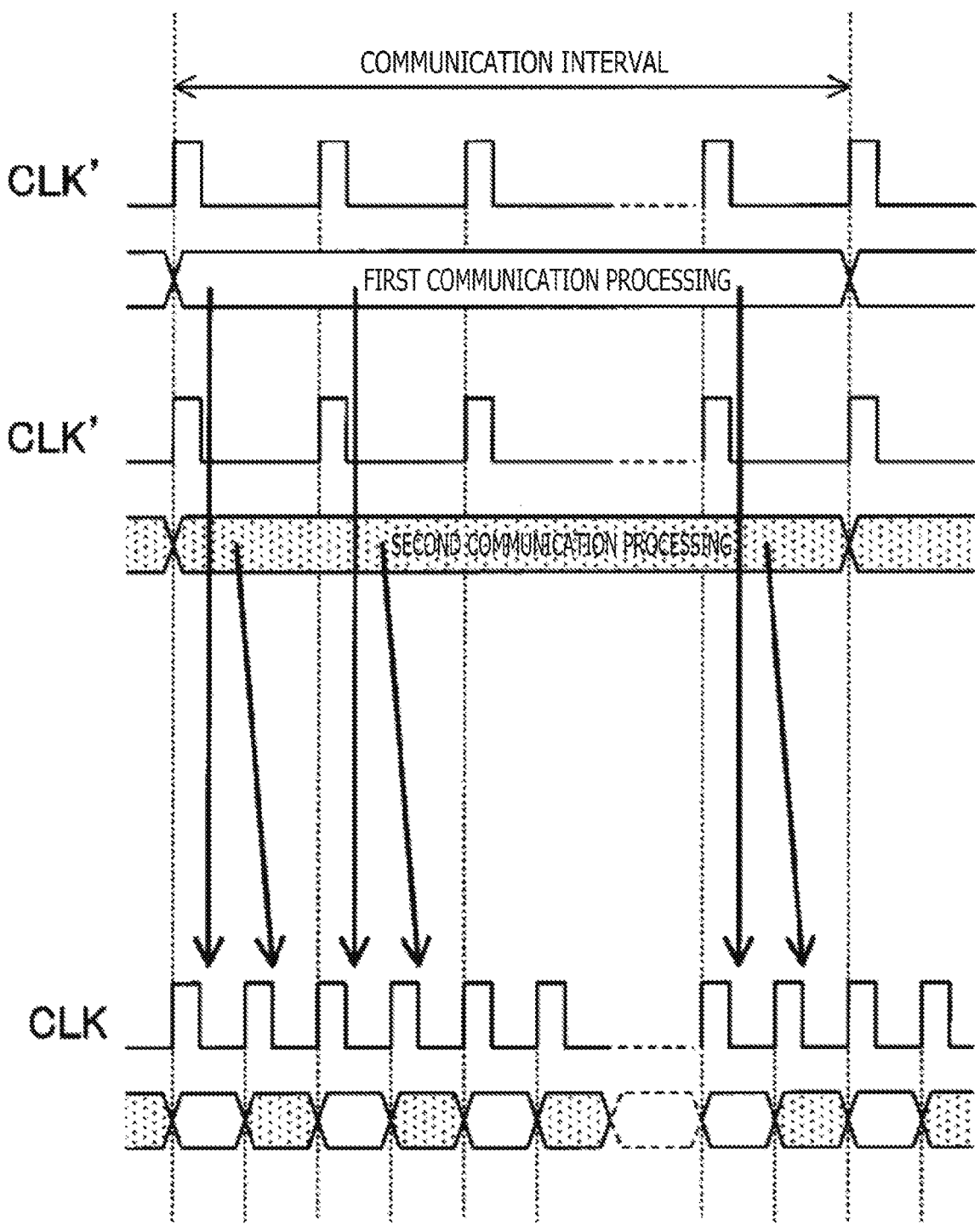
FIG. 8 is a diagram for a comparison between the reference apparatus and an apparatus according to the first embodiment of the present disclosure.

Then, in the reference apparatus 900, during a communication interval, the first communication processing and the second communication processing are executed in parallel at a speed equivalent to 100 kHz on the basis of the clock signal CLK' using the two digital processing circuits 910 as illustrated in an upper stage in FIG. 8. In contrast, in the data processing apparatus 1, during the communication interval, the first communication processing and the second communication processing are executed in parallel using one digital processing circuit 2 as illustrated in a lower stage in FIG. 8. At this time, in the digital processing circuit 2, processing for one clock included in the first communication processing and processing for one clock included in the second communication processing are alternately executed at intervals of the reciprocal of 200 kHz on the basis of the clock signal CLK. On the whole, the first communication processing is executed at a speed equivalent to 100 kHz, and the second communication processing is executed at a speed equivalent to 100 kHz. Thus, the needed communication is achieved.

As described above, the configuration according to Example EX1_1 doubles the frequency of the clock signal used and is particularly suitable for circuits not involving high speed requirements. For example, an apparatus is assumed that needs a central processing unit (CPU) operating in accordance with a 20-MHz raw clock signal, a first timer causing a first interruption request to be made to the CPU at intervals of the reciprocal of 100 kHz, and a second timer causing a second interruption request to be made to the CPU at intervals of the reciprocal of 200 kHz (none of the CPU and the first and second timers is illustrated). For example, the apparatus divides the frequency of the raw clock signal into ten 2-MHz frequency division clock signals, and the first and second timers function to count the frequency division clock signals, allowing the desired first and second interrupt requests to be generated.

At this time, the first and second timers need to perform parallel counting. However, applying, to such an apparatus, the configuration according to Example EX1_1 allows implementation of the functions of the first and second timers (that is, a function to generate a first interruption request at intervals of the reciprocal of 100 kHz and a function to generate a second interruption request at intervals of the reciprocal of 200 kHz). Even in this case, providing 2-MHz frequency division clock signals to the integrated timer is sufficient. In other words, a case where the first and second timers are separately provided and a case where one integrated timer is provided differ only in a count value at which generation of the interruption request is triggered. It is sufficient that a clock frequency for the timers is 2 MHz. This has no negative effect on application of the embodiments of the present disclosure. Note that each timer includes, as logic circuit, for example, an adder counting the number of clocks in the frequency division clock signal (for example, the number of up edges occurring in the frequency division clock signal).

Example EX1_2

Example EX1_2 will be described. In Example EX1_2, it is assumed that the input sections 106 and 107 in FIG. 2 are provided in the MSFF 100.

Figure 9:
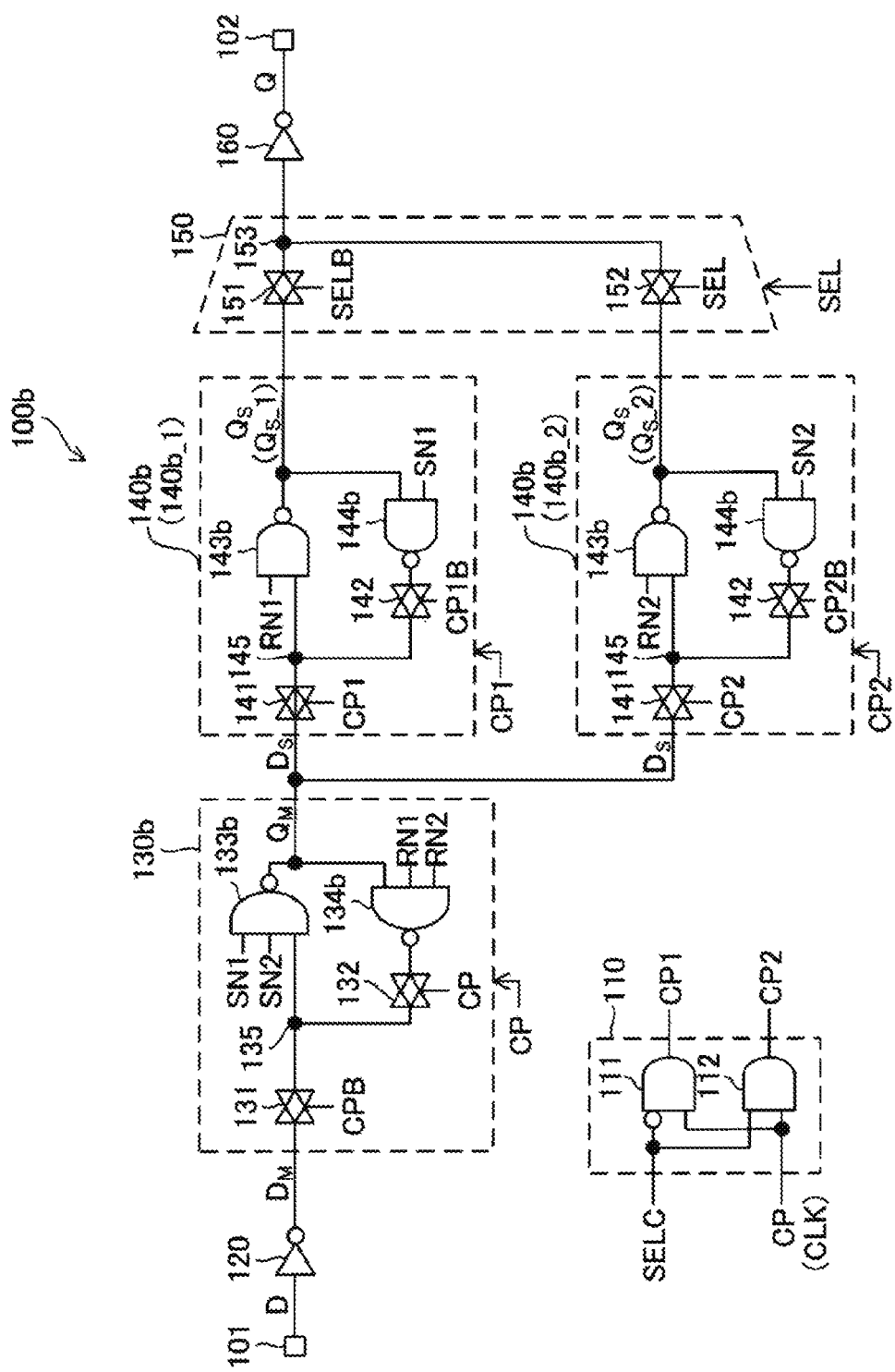
FIG. 9 is a configuration diagram of the multi-slave flip flop circuit according to Example EX1_2 belonging to the first embodiment of the present disclosure.

FIG. 9 is an internal configuration diagram of an MSFF 100*b* corresponding to the MSFF 100 according to Example EX1_2. The MSFF 100*b* includes the control signal generation circuit 110, the inverter circuit 120, a master latch circuit 130*b*, two slave latch circuit 140*b*, the output selection circuit 150, and the inverter circuit 160. Specifically, on the basis of the MSFF 100*a* in FIG. 3, the MSFF 100*b* is obtained by replacing the master latch circuit 130 and the two slave latch circuits 140 with the master latch circuit 130*b* and the two slave latch circuits 140*b*. In a case where the two slave latch circuits 140*b* are distinguished from each other, one of the two slave latch circuits 140*b* is referred to by a symbol "140*b*_1," and the other is referred to by a symbol "140*b*_2."

Except for the above-described replacement, the MSFF 100*b* in FIG. 9 is similar to the MSFF 100*a* in FIG. 3. A difference of the MSFF 100*b* from the MSFF 100*a* will be focused on, and for matters with no particular description, the description of Example EX1_1 may also be applied to Example EX1_2. However, when the description of Example EX1_1 is applied to Example EX1_2, reference symbols "100*a*," "130," "140," "140_1," and "140_2" in Example EX1_1 are respectively replaced with reference symbols "100*b*," "130*b*," "140*b*," "140*b*_1," and "140*b*_2" in Example EX1_2.

The signal indicating the master input data DM is fed to the input end of the master latch circuit 130*b*, and the signal indicating the master output data QM corresponding to the master input data DM is output from the output end of the master latch circuit 130*b*. The signal indicating the master output data QM is fed to the input end of each slave latch circuit 140*b* as the signal indicating the slave input data DS. Each slave latch circuit 140*b* generates the slave output data QS corresponding to the slave input data DS and outputs, from the output end of the slave latch circuit 140*b*, the signal indicating the slave output data QS. The output selection circuit 150 selects either one of the two slave output data QS from the two slave latch circuit 140*b* on the basis of the output selection signal SEL and outputs the signal indicating the selected slave output data QS.

A set signal SET (see FIG. 2) for the MSFF 100*b* includes set signals SN1 and SN2, and a reset signal RST (see FIG. 2) for the MSFF 100*b* includes reset signals RN1 and RN2. The set signals SN1 and SN2 and the reset signals RN1 and RN2 are each a 1-bit digital signal taking the high or low signal level.

The master latch circuit 130*b* includes switches 131 and 132 and NAND circuits 133*b* and 134*b*. Specifically, with reference to the master latch circuit 130 in FIG. 3, the master latch circuit 130*b* in FIG. 9 is obtained by replacing the inverter circuits 133 and 134 with the NAND circuits 133*b* and 134*b*. Each of the NAND circuits 133*b* and 134*b* includes a first to a third input ends and an output end, and a NAND signal of three signals applied to the first to third input ends is output from the output end.

The signal indicating the master input data DM is input from the inverter circuit 120 to the first end of the switch 131, and the second end of the switch 131 is connected to the node 135. The set signals SN1 and SN2 are input to the first and second input ends of the NAND circuit 133*b*, and a third input end of the NAND circuit 133*b* is connected to the node 135. Accordingly, the NAND circuit 133*b* outputs a low-level signal from the output end of the NAND circuit 133*b* only when the set signals SN1 and SN2 and a signal from the node 135 are all at the high level, and otherwise outputs a high-level signal. The output signal from the NAND circuit 133*b* corresponds to the signal indicating the master output data QM.

The output end of the NAND circuit 133*b* is connected to the first input end of the NAND circuit 134*b*. The reset signals RN1 and RN2 are input to the second and third input ends of the NAND circuit 134*b*. Accordingly, the NAND circuit 134*b* outputs a low-level signal from the output end of the NAND circuit 134*b* only when the output signal from the NAND circuit 133*b* and the reset signals RN1 and RN2 are all at the high level, and otherwise outputs a high-level signal. The first end of the switch 132 is connected to the output end of the NAND circuit 134*b*, and the second end of the switch 132 is connected to the node 135.

The clock signal CP is input to the control end of the switch 132 and the inversion signal CPB of the clock signal CP is input to the control end of the switch 131, as is the case with Example EX1_1. Accordingly, the master latch circuit 130*b* is in the through state (master through state) when the clock signal CP is at the low level, and is in the hold state (master hold state) when the clock signal CP is at the high level.

The master latch circuit 130*b* can be considered to include a master output circuit that can output the master output data QM corresponding to the master input data DM and a master feedback circuit that can feed back the master output data QM to the input side of the master output circuit. In the master latch circuit 130*b* in FIG. 9, the master output circuit includes the NAND circuit 133*b* or the switch 131 and the NAND circuit 133*b*, and the master feedback circuit includes the NAND circuit 134*b* or the switch 132 and the NAND circuit 134*b*. Feedback from the master feedback circuit means feeding, to the node 135, of the output signal from the NAND circuit 134*b* based on the master output data QM.

In the master latch circuit 130*b*, in the through state (master through state), the current master output data QM (output data from the NAND circuit 133*b*) is generated on the basis of the current master input data DM without feedback from the master feedback circuit. In the hold state (master hold state), the current master output data QM is generated on the basis of feedback data from the master feedback circuit (output data from the NAND circuit 134*b*) regardless of the current master input data DM.

However, in the master latch circuit 130*b*, in each of the through state and the hold state, the master output data QM is generated with also reference to the set signals SN1 and SN2, and in the hold state, the master output data QM is generated with also reference to the reset signals RN1 and RN2.

The slave latch circuit 140*b*_1 and 140*b*_2, corresponding to two slave latch circuits 140*b*, have the same configuration, and each slave latch circuit 140*b* includes switches 141 and 142 and NAND circuits 143*b* and 144*b*. Specifically, with reference to the slave latch circuit 140 in FIG. 3, the slave latch circuit 140*b* in FIG. 9 is obtained by replacing the inverter circuits 143 and 144 with the NAND circuits 143*b* and 144*b*. Each of the NAND circuits 143*b* and 144*b* includes a first and a second input ends and an output end, and a NAND signal of two signals applied to the first and second input ends is output from the output end. In each of the slave latch circuits 140*b*_1 and 140*b*_2, the signal indicating the master output data QM from the master latch circuit 130*b* is input as the signal indicating the slave input data DS.

In each slave latch circuit 140*b*, the second end of the switch 141 is connected to the node 145. The reset signal is input to the first input end of the NAND circuit 143*b*, and the second input end of the NAND circuit 143*b* is connected to the node 145. However, the reset signals RN1 and RN2 are respectively used for the slave latch circuits 140*b*_1 and 140*b*_2. Accordingly, in the slave latch circuit 140*b*_1, the NAND circuit 143*b* outputs a low-level signal from the output end of the NAND circuit 143*b* only when the reset signal RN1 and the signal from the node 145 are all at the high level, and otherwise outputs a high-level signal. In the slave latch circuit 140*b*_2, the NAND circuit 143*b* outputs a low-level signal from the output end of the NAND circuit 143*b* only when the reset signal RN2 and the signal from the node 145 are all at the high level, and otherwise outputs a high-level signal. In each slave latch circuit 140*b*, the output signal from the NAND circuit 143*b* corresponds to the signal indicating the slave output data QS. The slave output data QS generated and output by the slave latch circuits 140*b*_1 and 140*b*_2 are referred to by reference symbols "QS_1" and "QS_2."

In each of the slave latch circuit 140*b*, the output end of the NAND circuit 143*b* is connected to the first input end of the NAND circuit 144*b*, and the set signal is input to the second input end of the NAND circuit 144*b*. However, the set signals SN1 and SN2 are respectively used for the slave latch circuits 140*b*_1 and 140*b*_2. Accordingly, in the slave latch circuit 140*b*_1, the NAND circuit 144*b* outputs a low-level signal from the output end of the NAND circuit 144*b* only when the set signal SN1 and the output signal (QS_1) from the NAND circuit 143*b* are all at the high level, and otherwise outputs a high-level signal. In the slave latch circuit 140*b*_2, the NAND circuit 144*b* outputs a low-level signal from the output end of the NAND circuit 144*b* only when the set signal SN2 and the output signal (QS_2) from the NAND circuit 143*b* are all at the high level, and otherwise outputs a high-level signal. In each slave latch circuit 140*b*, the first end of the switch 142 is connected to the output end of the NAND circuit 144*b*, and the second end of the switch 142 is connected to the node 145.

As is the case with Example EX1_1, in the slave latch circuit 140*b*_1, the control signal CP1 is input to the control end of the switch 141, while the inversion signal CP1B of the control signal CP1 is input to the control end of the switch 142. In the slave latch circuit 140*b*_2, the control signal CP2 is input to the control end of the switch 141, while the inversion signal CP2B of the control signal CP2 is input to the control end of the switch 142.

Thus, the slave latch circuit 140*b*_1 is in the through state (slave through state) when the control signal CP1 is at the high level, and is in the hold state (slave hold state) when the control signal CP1 is at the low level. In contrast, the slave latch circuit 140*b*_2 is in the through state (slave through state) when the control signal CP2 is at the high level, and is in the hold state (slave hold state) when the control signal CP2 is at the low level.

Each of the slave latch circuits 140*b*_1 and 140*b*_2 can be considered to include a slave output circuit that can output the slave output data QS corresponding to the slave input data DS and a slave feedback circuit that can feed back the slave output data QS to the input side of the slave output circuit. In each slave latch circuit 140*b* in FIG. 9, the slave output circuit includes the NAND circuit 143*b* or the switch 141 and the NAND circuit 143*b*, and the slave feedback circuit includes the NAND circuit 144*b* or the switch 142 and the NAND circuit 144*b*. Feedback from the slave feedback circuit means feeding, to the node 145, of the output signal from the NAND circuit 144*b* based on the slave output data QS.

In each slave latch circuit 140*b*, in the through state (slave through state), the current slave output data QS (output data of the NAND circuit 143*b*) is generated on the basis of the current slave input data DS without feedback from the slave feedback circuit. In the hold state (slave hold state), the current slave output data QS is generated on the basis of feedback data from the slave feedback circuit (output data from the NAND circuit 144*b*) regardless of the current slave input data DS.

However, in the slave latch circuit 140*b*_1, in the hold state, the slave output data QS (QS_1) is generated with also reference to the set signal SN1, and in each of the through state and the hold state, the slave output data QS (QS_1) is generated with also reference to the reset signal RN1. Similarly, in the slave latch circuit 140*b*_2, in the hold state, the slave output data QS (QS_2) is generated with also reference to the set signal SN2, and in each of the through state and the hold state, the slave output data QS (QS_2) is generated with also reference to the reset signal RN2.

The set signals (SN1 and SN2) are signals of negative logic, and the set signals of the low level (SN1 and SN2) function as signals for setting, to the high level, the signal indicating the output data Q (that is, function as signals for setting "1" in the output data Q). The reset signals (RN1 and RSN2) are signals of negative logic, and the reset signals of the low level (RN1 and RN2) function as signals for setting, to the low level, the signal indicating the output data Q (that is, function as signals for setting "0" in the output data Q).

Example EX1_3

Example EX1_3 will be described. In Examples EX1_1 and EX1_2, two slave latch circuits are provided in parallel with one master latch circuit. However, N slave latch circuits can be provided in parallel with one master latch circuit, and N may be any integer of 2 or larger.

Figure 10:
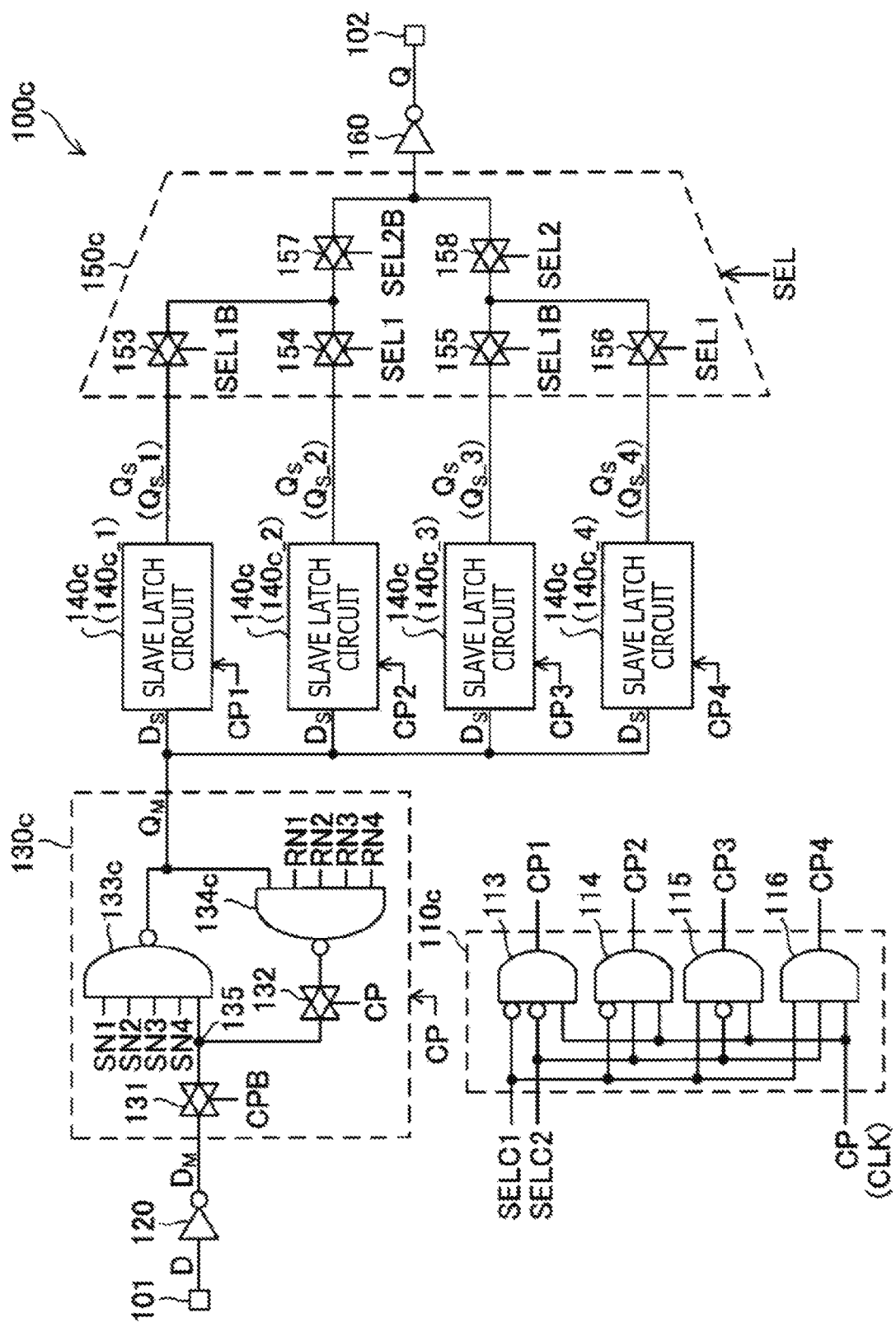
FIG. 10 is a configuration diagram of the multi-slave flip flop circuit according to Example EX1_3 belonging to the first embodiment of the present disclosure.

FIG. 10 illustrates a configuration example of an MSFF in a case where "N=4." FIG. 10 is an internal configuration diagram of an MSFF 100c corresponding to the MSFF 100 according to Example EX1_3. The MSFF 100c includes a control signal generation circuit 110c, the inverter circuit 120, a master latch circuit 130c, four slave latch circuit 140c, an output selection circuit 150c, and the inverter circuit 160. In a case where four slave latch circuits 140c need to be distinguished from one another, the four slave latch circuits 140c are referred to by reference symbols "140c_1," "140c_2," "140c_3," and "140c_4."

A difference of the MSFF 100c from the MSFF 100a according to Example EX1_1 or the MSFF 100b according to Example EX1_2 will be focused on, and for matters with no particular description, the description of Example EX1_1 or EX1_2 may also be applied to Example EX1_3. However, when the description of Example EX1_1 or EX1_2 is applied to Example EX1_3, reference symbols "100a," "130," and "140" in the description of Example EX1_1 or "100b," "130b," and "140b" in the description of Example EX1_2 are respectively replaced with reference symbols "100c," "130c," and "140c" in Example EX1_3. Note that it is assumed that, in Example EX1_3, the input sections 106 and 107 in FIG. 2 are provided in the MSFF 100c.

In Example EX1_3, the clock selection signal SELC includes clock selection signals SELC1 and SELC2. Each of the clock selection signals SELC1 and SELC2 is a 1-bit digital signal and takes the high or low signal level. The clock signal CP and the clock selection signals SELC1 and SELC2 are input to the control signal generation circuit 110c.

The control signal generation circuit 110c generates control signals CP1 to CP4 on the basis of the signals SELC1 and SELC2 and CP. Specifically, the circuit 110c includes AND circuits 113 to 116. The AND circuit 113 outputs an AND signal of an inversion signal of the signal SELC1 and an inversion signal of the signal SELC2 and the signal CP as the control signal CP1. The AND circuit 114 outputs an AND signal of an inversion signal of the signal SELC1, the signal SELC2, and the signal CP as the control signal CP2. The AND circuit 115 outputs an AND signal of the signal SELC1, an inversion signal of the signal SELC2, and the signal CP as the control signal CP3. The AND circuit 116 outputs an AND signal of the signal SELC1, the signal SELC2, and the signal CP as the control signal CP4.

Accordingly, when the clock selection signals SELC1 and SELC2 are both at the low level, the control signal CP1 corresponds to a specific control signal and the control signals CP2 to CP4 correspond to non-specific control signals. When the clock selection signals SELC1 and SELC2 are respectively at the low level and at the high level, the control signal CP2 corresponds to the specific control signal and the control signals CP1, CP3, and CP4 correspond to the non-specific control signals. When the clock selection signals SELC1 and SELC2 are respectively at the high level and at the low level, the control signal CP3 corresponds to the specific control signal and the control signals CP1, CP2, and CP4 correspond to the non-specific control signals. When the clock selection signals SELC1 and SELC2 are both at the high level, the control signal CP4 corresponds to the specific control signal and the control signals CP1 to CP3 correspond to non-specific control signals. As described above, the specific control signal means a control signal with the signal level changing in synchronization with the clock signal CP, and the non-specific control signals mean control signals with the signal level fixed to a predetermined level (in this case, the low level). The control signal generation circuit 110c may be a circuit that uses any one of the control signals CP1 to CP4 as the specific control signal and that uses the remaining three control signals as the non-specific control signals, on the basis of the clock selection signals SELC1 and SELC2.

As described above, any one of the control signals CP1 to CP4 is equivalent to the clock signal CP. The control signals CP1, CP2, CP3, and CP4 are respectively fed to the slave latch circuits 140c_1, 140c_2, 140c_3, and 140c_4. Accordingly, the clock selection signals SELC1 and SELC2 function as signals for selecting which of the four slave latch circuits 140c is fed with the clock signal CP. The control signals CP1 to CP4 may be replaced with a first to a fourth clock signals, and in this case, the clock signals CLK and CP may be referred to as reference clock signals.

The signal indicating the input data D is fed to the input end of the inverter circuit 120, and the inversion signal of the signal indicating the input data D is output from the output end of the inverter circuit 120. The output signal from the inverter circuit 120 (that is, the inversion signal of the signal indicating the input data D) functions as the signal indicating the master input data DM. The signal indicating the master input data DM is fed to the input end of the master latch circuit 130c, and the signal indicating the master output data QM corresponding to the master input data DM is output from the output end of the master latch circuit 130c. The signal indicating the master output data QM is fed to the input end of each slave latch circuit 140c as the signal indicating the slave input data DS. Each slave latch circuit 140c generates the slave output data QS corresponding to the slave input data DS and outputs, from the output end of the slave latch circuit 140c, the signal indicating the slave output data QS. The output selection circuit 150c selects any one of the four slave output data QS from the four slave latch circuits 140c on the basis of the output selection signal SEL, and outputs a signal indicating the selected slave output data QS. The inverter circuit 160 generates, as a signal indicating the output data Q, an inversion signal of the signal indicating the slave output data QS selected and output by the output selection circuit 150c. The signal indicating the output data Q is output from the data output section 102.

The master latch circuit 130c operates in synchronization with the clock signal CP and loads and holds (latches) the data DM in response to predetermined level change in the clock signal CP. The data held by the master latch circuit 130c is used as the master output data QM. A slave latch circuit 140c_i operates in synchronization with the a control signal CPi, and the data DS matching the data QM is loaded and held (latched) in response to a predetermined level change in control signal CPi ("i" in this case is 1, 2, 3, or 4).

The set signal SET (see FIG. 2) for the MSFF 100c includes set signals SN1 to SN4, and the reset signal RST (see FIG. 2) for the MSFF 100c includes reset signals RN1 to RN4. The set signals SN1 to SN4 and the reset signals RN1 to RN4 are each a 1-bit digital signal taking the low or high signal level.

The master latch circuit 130c includes the switches 131 and 132 and NAND circuits 133c and 134c. Specifically, with reference to the master latch circuit 130 in FIG. 3, the master latch circuit 130c in FIG. 10 is obtained by replacing the inverter circuits 133 and 134 with the NAND circuits 133c and 134c. Each of the NAND circuits 133c and 134c includes a first to a fifth input ends and an output end, and a NAND signal of five signals applied to the first to fifth input ends is output from the output end.

The signal from the inverter circuit 120 indicating the master input data DM is input to the first end of the switch 131, and the second end of the switch 131 connected to the node 135. The set signals SN1 to SN4 are input to the first to fourth input ends of the NAND circuit 133c, and the fifth input end of the NAND circuit 133c is connected to the node 135. Accordingly, the NAND circuit 133c outputs a low-level signal from the output end of the NAND circuit 133c only when the set signals SN1 to SN4 and the signal from the node 135 are all at the high level, and otherwise outputs a high-level signal. The output signal from the NAND circuit 133c corresponds to the signal indicating the master output data QM.

The output end of the NAND circuit 133c is connected to the first input end of the NAND circuit 134c. Reset signals RN1 to RN4 are respectively input to the second to fifth input ends of the NAND circuit 134c. Accordingly, the NAND circuit 134c outputs a low-level signal from the output end of the NAND circuit 134c only when the output signal from the NAND circuit 133c and the reset signals RN1 to RN4 are all at the high level, and otherwise outputs a high-level signal. The first end of the switch 132 is connected to the output end of the NAND circuit 134c, and the second end of the switch 132 is connected to the node 135.

The clock signal CP is input to the control end of the switch 132 and the inversion signal CPB of the clock signal CP is input to the control end of the switch 131, as is the case with Example EX1_1. Accordingly, the master latch circuit 130c is in the through state (master through state) when the clock signal CP is at the low level, and is in the hold state (master hold state) when the clock signal CP is at the high level.

The master latch circuit 130c can be considered to include a master output circuit that can output the master output data QM corresponding to the master input data DM and a master feedback circuit that can feed back the master output data QM to the input side of the master output circuit. In the master latch circuit 130c in FIG. 10, the master output circuit includes the NAND circuit 133c or the switch 131 and the NAND circuit 133c, and the master feedback circuit includes the NAND circuit 134c or the switch 132 and the NAND circuit 134c. Feedback from the master feedback circuit means feeding, to the node 135, of the output signal from the NAND circuit 134c based on the master output data QM.

In the master latch circuit 130c, in the through state (master through state), the current master output data QM (output data from the NAND circuit 133c) is generated on the basis of the current master input data DM without feedback from the master feedback circuit. In the hold state (master hold state), the current master output data QM is generated on the basis of feedback data from the master feedback circuit (output data from the NAND circuit 134c) regardless of the current master input data DM.

However, in the master latch circuit 130c, in each of the through state and the hold state, the master output data QM is generated with also reference to the set signals SN1 to SN4, and in the hold state, the master output data QM is generated with also reference to the reset signals RN1 to RN4.

Figure 11:
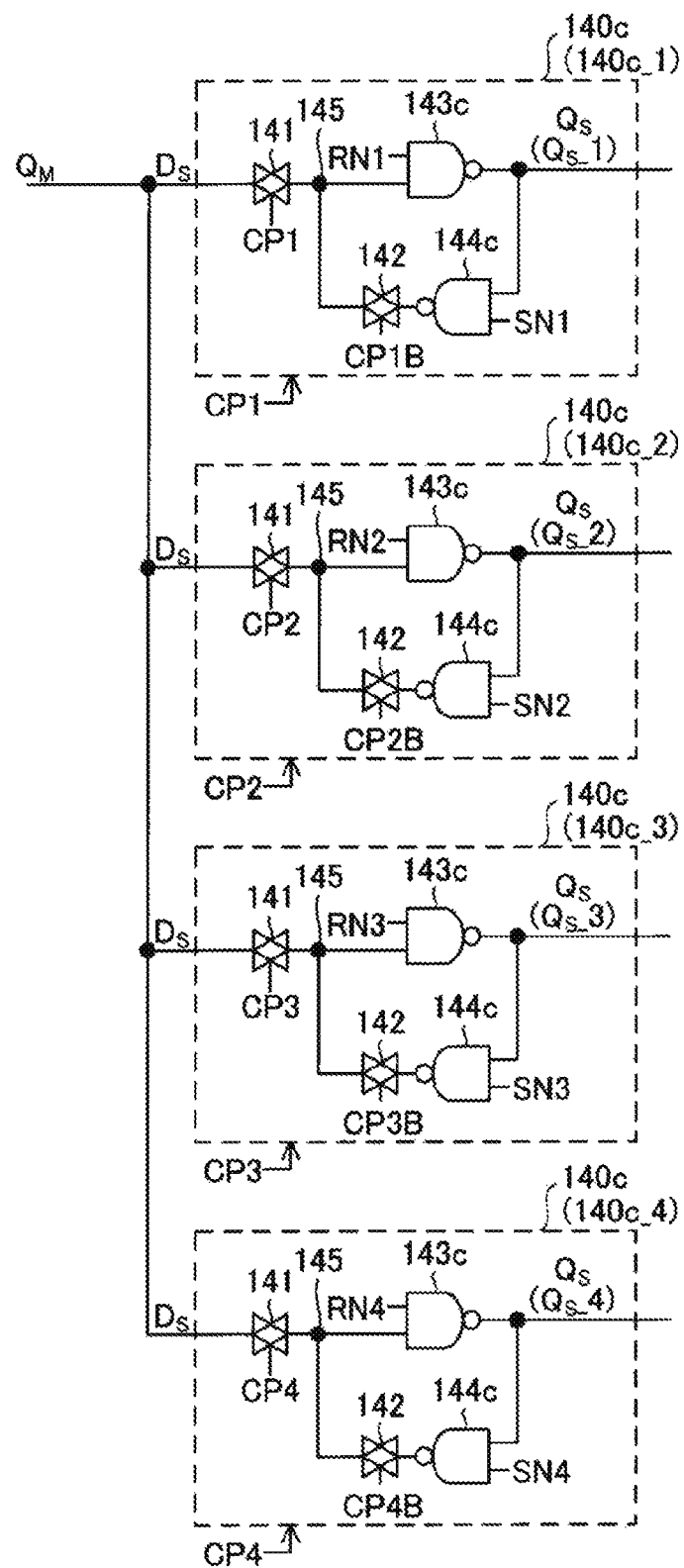
FIG. 11 is a circuit diagram of four slave latch circuits illustrated in FIG. 10.

FIG. 11 illustrates a configuration of each of slave latch circuits 140c_1 to 140c_4 provided in the MSFF 100c. The slave latch circuits 140c_1 to 140c_4 have the same configuration, and each slave latch circuit 140c includes the switches 141 and 142 and the NAND circuits 143c and 144c. Specifically, with reference to each slave latch circuit 140 in FIG. 3, each slave latch circuit 140c in FIG. 11 is obtained by replacing the inverter circuits 143 and 144 with NAND circuits 143c and 144c. Each of the NAND circuits 143c and 144c includes a first to a second input ends and an output end, and a NAND signal of two signals applied to the first and second input ends is output from the output end. In each of the slave latch circuits 140c_1 to 140c_4, the signal from the master latch circuit 130c indicating the master output data QM is input to the first end of the switch 141 as the signal indicating the slave input data DS.

In each slave latch circuit 140c, the second end of the switch 141 is connected to the node 145. The reset signal is input to the first input end of the NAND circuit 143c, and the second input end of the NAND circuit 143c is connected to the node 145. However, the reset signals RN1, RN2, RN3, and RN4 are respectively used for the slave latch circuits 140c_1, 140c_2, 140c_3, and 140c_4. Accordingly, in the slave latch circuit 140c_1, the NAND circuit 143c outputs a low-level signal from the output end of the NAND circuit 143c only when the reset signal RN1 and the signal from the node 145 are both at the high level, and otherwise outputs a high-level signal. Similarly, in the slave latch circuit 140c_2, the NAND circuit 143c outputs a low-level signal from the output end of the NAND circuit 143c only when the reset signal RN2 and the signal from the node 145 are both at the high level, and otherwise outputs a high-level signal. This also applies to the slave latch circuits 140c_3 and 140c_4. In each slave latch circuit 140c, the output signal from the NAND circuit 143c corresponds to the signal indicating the slave output data QS. The slave output data QS generated and output by the slave latch circuit 140c_1, 140c_2, 140c_3, and 140c_4 are referred to by reference symbols "QS_1," "QS_2," "QS_3," and "QS_4."

In each slave latch circuit 140c, the output end of the NAND circuit 143c is connected to the first input end of the NAND circuit 144c, and the set signal is input to the second input end of the NAND circuit 144c. However, the set signals SN1, SN2, SN3, and SN4 are respectively used for the slave latch circuits 140c_1, 140c_2, 140c_3, and 140c_4. Accordingly, in the slave latch circuit 140c_1, the NAND circuit 144c outputs a low-level signal from the output end of the NAND circuit 144c only when the set signal SN1 and the output signal from the NAND circuit 143c (QS_1) are both at the high level, and otherwise outputs a high-level signal. In the slave latch circuit 140c_2, the NAND circuit 144c outputs a low-level signal from the output end of the NAND circuit 144c only when the set signal SN2 and the output signal from the NAND circuit 143c (QS_2) are both at the high level, and otherwise outputs a high-level signal. This also applies to the slave latch circuit 140c_3 and 140c_4. In each slave latch circuit 140c, the first end of the switch 142 is connected to the output end of the NAND circuit 144c, and the second end of the switch 142 is connected to the node 145.

As is the case with Example EX1_1, in the slave latch circuit 140c_1, the control signal CP1 is input to the control end of the switch 141, while the inversion signal CP1B of the control signal CP1 is input to the control end of the switch 142. In the slave latch circuit 140c_2, the control signal CP2 is input to the control end of the switch 141, while the inversion signal CP2B of the control signal CP2 is input to the control end of the switch 142. Furthermore, in the slave latch circuit 140c_3, the control signal CP3 is input to the control end of the switch 141, while the inversion signal CP3B of the control signal CP3 is input to the control end of the switch 142. In the slave latch circuit 140c_4, the control signal CP4 is input to the control end of the switch 141, while the inversion signal CP4B of the control signal CP4 is input to the control end of the switch 142.

Thus, the slave latch circuit 140c_1 is in the through state (slave through state) when the control signal CP1 is at the high level, and is in the hold state (slave hold state) when the control signal CP1 is at the low level.

The slave latch circuit 140c_2 is in the through state (slave through state) when the control signal CP2 is at the high level, and is in the hold state (slave hold state) when the control signal CP2 is at the low level.

The slave latch circuit 140c_3 is in the through state (slave through state) when the control signal CP3 is at the high level, and is in the hold state (slave hold state) when the control signal CP3 is at the low level.

The slave latch circuit 140c_4 is in the through state (slave through state) when the control signal CP4 is at the high level, and is in the hold state (slave hold state) when the control signal CP4 is at the low level.

Each of the slave latch circuits 140c_1 to 140c_4 can be considered to include a slave output circuit that can output the slave output data QS corresponding to the slave input data DS and a slave feedback circuit that can feed back the slave output data QS to the input side of the slave output circuit. In each slave latch circuit 140c in FIG. 11, the slave output circuit includes the NAND circuit 143c or the switch 141 and the NAND circuit 143c, and the slave feedback circuit includes the NAND circuit 144c or the switch 142 and the NAND circuit 144c. Feedback from the slave feedback circuit means feeding, to the node 145, of the output signal from the NAND circuit 144c based on the slave output data QS.

In each slave latch circuit 140c, in the through state (slave through state), the current slave output data QS (output data from the NAND circuit 143c) is generated on the basis of the current slave input data DS without feedback from the slave feedback circuit. In the hold state (slave hold state), the current slave output data QS is generated on the basis of feedback data from the slave feedback circuit (output data from the NAND circuit 144c) regardless of the current slave input data DS.

However, in the slave latch circuit 140c_1, in the hold state, the slave output data QS (QS_1) is generated with also reference to the set signal SN1, and in each of the through state and the hold state, the slave output data QS (QS_1) is generated with also reference to the reset signal RN1.

Similarly, in the slave latch circuit 140c_2, in the hold state, the slave output data QS (QS_2) is generated with also reference to the set signal SN2, and in each of the through state and the hold state, the slave output data QS (QS_2) is generated with also reference to the reset signal RN2.

This also applies to the slave latch circuits 140c_3 and 140c_4.

The set signals (SN1 to SN4) are signals of negative logic, and the set signals of the low level (SN1 to SN4) function as signals for setting, to the high level, the signal indicating the output data Q (that is, function as signals for setting "1" in the output data Q). The reset signals (RN1 to RSN4) are signals of negative logic, and the reset signals of the low level (RN1 to RN4) function as signals for setting, to the low level, the signal indicating the output data Q (that is, function as signals for setting "0" in the output data Q).

FIG. 10 is referred to again. The output selection circuit 150c selects one of the slave output data QS_1 to QS_4 from the slave latch circuits 140c_1 to 140c_4 on the basis of the output selection signal SEL, and outputs the selected data to the inverter circuit 160. In Example EX1_3, the output selection signal SEL includes output selection signals SEL1 and SEL2. Each of the output selection signals SEL1 and SEL2 is a 1-bit digital signal and takes the high or low signal level.

Specifically, the output selection circuit 150c includes switches 153 to 158. Signals indicating the slave output data QS_1 to QS_4 are respectively applied to first ends of the switches 153 to 156. Second ends of the switches 153 and 154 are connected in common to a first end of the switch 157, and second ends of the switches 155 and 156 are connected in common to a first end of the switch 158. Furthermore, second ends of the switches 157 and 158 are connected in common at an output end of the output selection circuit 150c. The output end of the output selection circuit 150c is connected to the input end of the inverter circuit 160.

The signal SEL1 is input to a control end of each of the switches 154 and 156, and an inversion signal SEL1B of the signal SEL1 is input to a control end of each of the switches 153 and 155. The signal SEL2 is input to a control end of the switch 158, and an inversion signal SEL2B of the signal SEL2 is input to a control end of the switch 157. Thus, any one of the slave output data QS_1 to QS_4 is selected depending on a combination of the low and high levels of the signals SEL1 and SEL2, and a signal indicating the selected data is output from the output selection circuit 150c. The selected data is output from the data output section 102 through the inverter circuit 160 as the output data Q.

Operation similar to the operation in the operation example in FIG. 6 can be applied to the MSFF 100c. However, the MSFF 100c includes the four slave latch circuit 140c, and thus each time one period of the clock signal CLK (=CP) elapses, the data A1, B1, C1, D1, A2, B2, C2, D2, A3, B3, C3, D3, A4, B4, C4, D4, . . . may be fed to the MSFF 100c as the input data D.

In this case, the clock selection signals SELC1 and SELC2 may be fed to the MSFF 100c such that the data A1 to A4 are sequentially latched by the slave latch circuit 140c_1 and that the data B1 to B4 are sequentially latched by the slave latch circuit 140c_2 and that the data C1 to CA4 are sequentially latched by the slave latch circuit 140c_3 and that the data D1 to D4 are sequentially latched by the slave latch circuit 140c_4. In addition, the output selection signals SELC and SEL2 may be fed to the MSFF 100c such that the data A1, B1, C1, D1, A2, B2, C2, D2, A3, B3, C3, D3, A4, B4, C4, D4, . . . are output from the MSFF 100c as the output data Q.

In other words, in the MSFF 100c, the state control circuit 3 may feed the clock selection signal SELC (SELC1 and SELC2) to the MSFF 100c such that the master input data DM at the first, second, third, and fourth timings (in this case, the master input data DM match the input data D) are respectively loaded into and held by the slave latch circuits 140c_1, 140c_2, 140c_3, and 140c_4. The first to fourth timings are different from one another. Specifically, the first timing corresponds to a timing when the master input data DM corresponds to the data A1, A2, A3, or A4, the second timing corresponds to a timing when the master input data DM corresponds to the data B1, B2, B3, or B4, the third timing corresponds to a timing when the master input data DM corresponds to the data C1, C2, C3, or C4, and the fourth timing corresponds to a timing when the master input data DM corresponds to the data D1, D2, D3, or D4. By controlling the level of the output selection signal SEL (SEL1 and SEL2) for the MSFF 100c, the state control circuit 3 may cause the data held by the slave latch circuits 140c_1, 140c_2, 140c_3, and 140c_4 (for example, the data A1, B1, C1, and D1) to be output from the data output section 102 as the output data Q at different timings.

The use of the MSFF 100c allows the logic circuit 20 in FIG. 1 to execute, in parallel, the first signal processing based on the data for the first processing, the second signal processing based on the data for the second processing, the third signal processing based on the data for the third processing, and the fourth signal processing based on the data for the fourth processing. The data for the first processing refers to one of the data A1 to A4 or is a generic term for the data A1 to A4. The data for the second processing refers to one of the data B1 to B4 or is a generic term for the data B1 to B4. The data for the third processing refers to one of the data C1 to C4 or is a generic term for the data C1 to C4. The data for the fourth processing refers to one of the data D1 to D4 or is a generic term for the data D1 to D4. The data for the first processing (A1 to A4), the data for the second processing (B1 to B4), the data for the third processing (C1 to C4), and the data for the fourth processing (D1 to D4) are different from one another. However, the values of these data may accidentally be equal to one another.

In a case where each MSFF 10 in FIG. 1 is configured as the MSFF 100c, the data A1 to A4, B1 to B4, C1 to C4, and D1 to D4 are I/O data transmitted to and from the respective MSFFs 10, the data A1 to A4 correspond to the data for the first processing, which is a part of the I/O data transmitted to and from each MSFF 10, the data B1 to B4 correspond to the data for the second processing, which is another part of the I/O data transmitted to and from each MSFF 10, the data C1 to C4 correspond to the data for the third processing, which is yet another part of the I/O data transmitted to and from each MSFF 10, and the data D1 to D4 correspond to the data for the fourth processing, which is still another part of the I/O data transmitted to and from each MSFF 10.

During the interval when each MSFF 10 inputs the data for the first processing (A1 to A4) to the logic circuit 20, the logic circuit 20 executes the first signal processing based on the data for the first processing and outputs data indicating the results of the first signal processing to each MSFF 30 as the first signal processing result data. During the interval when each MSFF 10 inputs the data for the second processing (B1 to B4) to the logic circuit 20, the logic circuit 20 executes the second signal processing based on the data for the second processing and outputs data indicating the results of the second signal processing to each MSFF 30 as the second signal processing result data. During the interval when each MSFF 10 inputs the data for the third processing (C1 to C4) to the logic circuit 20, the logic circuit 20 executes the third signal processing based on the data for the third processing and outputs data indicating the results of the third signal processing to each MSFF 30 as the third signal processing result data. During the interval when each MSFF 10 inputs the data for the fourth processing (D1 to D4) to the logic circuit 20, the logic circuit 20 executes the fourth signal processing based on the data for the fourth processing and outputs data indicating the results of the fourth signal processing to each MSFF 30 as the fourth signal processing result data.

In a case where each MSFF 30 in FIG. 1 is configured as the MSFF 100c, the data A1 to A4, B1 to B4, C1 to C4, and D1 to D4 are I/O data transmitted to and from the respective MSFFs 30, the data A1 to A4 correspond to the first signal processing result data, which is a part of the I/O data transmitted to and from each MSFF 30, the data B1 to B4 correspond to the second signal processing result data, which is another part of the I/O data transmitted to and from each MSFF 30, the data C1 to C4 correspond to the third signal processing result data, which is yet another part of the I/O data transmitted to and from each MSFF 30, and the data D1 to D4 correspond to the fourth signal processing result data, which is still another part of the I/O data transmitted to and from each MSFF 30. During the interval when the MSFFs 30 feed the first, second, third, and fourth signal processing result data to the succeeding circuit 50, the succeeding circuit 50 can execute predetermined processing based on the first, second, third, and fourth signal processing result data.

Second Embodiment

A second embodiment of the present disclosure will be described. The second embodiment and a third embodiment described below are based on the first embodiment, and for matters not particularly described in the second and third embodiments, the description in the first embodiment is applied to the second and third embodiments unless the application leads to inconsistency. In interpretation of the description in the second embodiment, for matters that are inconsistent between the first and second embodiments, the description in the second embodiment may be prioritized (this also applies to the third embodiment described below). Any plurality of embodiments included in the first to third embodiments may be combined together unless the combination leads to inconsistency.

Figure 12:
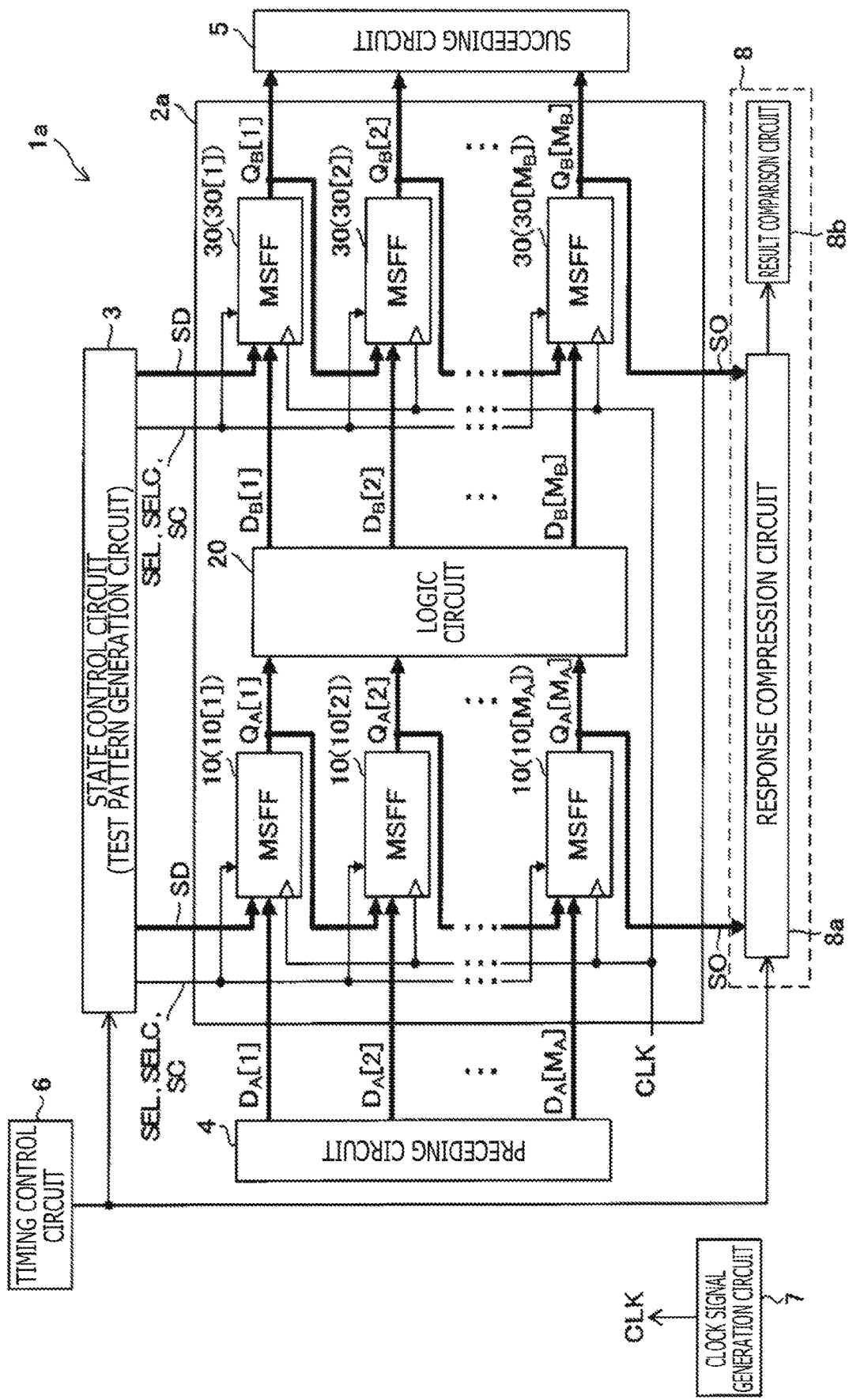
FIG. 12 is a configuration diagram of a data processing apparatus according to a second embodiment of the present disclosure.

In the second embodiment, a technique will be described in which the structure of the MSFF illustrated in the first embodiment is utilized for a scan test. FIG. 12 is a configuration diagram of a data processing apparatus 1a according to the second embodiment. With reference to the data processing apparatus 1 in FIG. 1, the data processing apparatus 1a is formed by replacing the digital processing circuit 2 with a digital processing circuit 2a and adding a test result evaluation circuit 8 to the data processing apparatus 1. The test result evaluation circuit 8 includes a response compression circuit 8a and a result comparison circuit 8b. Like the digital processing circuit 2 in FIG. 1, the digital processing circuit 2a includes the MSFFs 10[1] to 10[MA], the logic circuit 20, and the MSFFs 30[1] to 30[MB]. The digital processing circuit 2a is similar to the digital processing circuit 2 except for the matters described below. When the description in the first embodiment is applied to the second embodiment, reference signs "1" and "2" in the description in the first embodiment are replaced with "1a" and "2a" in the second embodiment.

The state control circuit 3 according to the second embodiment feeds each of the MSFFs in the digital processing circuit 2a with an input selection signal SC in addition to the above-described output selection signal SEL and the clock selection signal SELC. In FIG. 12, for avoidance of complication, wires through which the signals SEL, SELC, and SC are transmitted are illustrated as one wire. However, the signals are transmitted through different wires.

Figure 13:
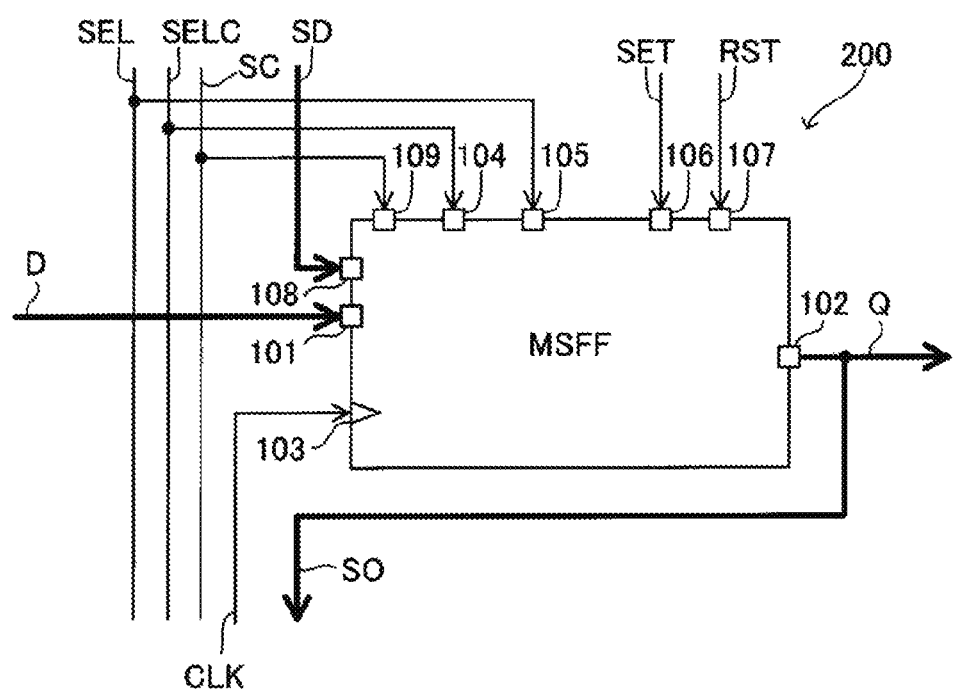
FIG. 13 is a configuration diagram related to input and output of data and signals to and from a multi-slave flip flop circuit according to the second embodiment of the present disclosure.

FIG. 13 illustrates a configuration related to input and output of data and signals to and from one MSFF 200. In the second embodiment, it is assumed that the MSFF 200 is used as each of the MSFFs 10[1] to 10[MA] and the MSFFs 30[1] to 30[MB] in FIG. 12.

The MSFF 200 further includes a scan input section 108 and an input selection signal input section 109 in addition to the input sections 101 and 103 to 107 and output section 102 included in the MSFF 100 in FIG. 2. Note that the input sections 106 and 107 may be omitted from the MSFF 200. In the data processing apparatus 1a in FIG. 12, the data DA[1] to DA[MA] are used as the input data D for the MSFFs 10[1] to 10[MA], and the data QA[1] to QA[MA] are used as the output data Q for the MSFFs 10[1] to 10[MA]. In the data processing apparatus 1a in FIG. 12, the data DB[1] to DB[MB] are used as the input data D for the MSFFs 30[1] to 30[MB], and the data QB[1] to QB[MB] are used as the output data Q for the MSFFs 30[1] to 30[MB].

In the MSFF 200, scan input data SD is input to the scan input section 108, and an input selection signal SC is input to the input selection signal input section 109. Like the MSFF 100 in FIG. 2, the data output section 102 of the MSFF 200 outputs the output data Q of the MSFF 200. However, the output data Q is also output as scan output data SO.

The state control circuit 3 according to the second embodiment includes a test pattern generation circuit and can feed the scan input data SD to the MSFF 10[1] and the MSFF 30[1] in a test mode.

For any integer i where 1≤i≤MA−1 is satisfied, the data output section 102 of an MSFF 10[i] is connected to the scan input section 108 of an MSFF 10[i+1]. Accordingly, the scan output data SO from the MSFF 10[i] is used as the scan input data SD to the MSFF 10[i+1]. The scan output data SO from the MSFF 10[MA] is provided to the response compression circuit 8a.

For any integer i where 1≤i≤MB−1 is satisfied, the data output section 102 of an MSFF 30[i] is connected to the scan input section 108 of an MSFF 30[i+1]. Accordingly, the scan output data SO from the MSFF 30[i] is used as the scan input data SD to the MSFF 30[i+1]. The scan output data SO from the MSFF 30[MB] is provided to the response compression circuit 8a.

The timing control circuit 6 runs, through control of the state control circuit 3, the state control circuit 3 and the digital processing circuit 2a in a normal mode or a test mode.

In the normal mode, an operation is performed in which the data QA[1] to QA[MA] are generated on the basis of the data DA[1] to DA[MA] from the preceding circuit 4, and an operation is also performed in which the data QB[1] to QB[MB] are generated on the basis of the output data DB[1] to DB[MB] obtained from the logic circuit 20 when the data QA[1] to QA[MA] resulting from the above-described operation is provided to the logic circuit 20.

In the test mode, at required timings, the MSFFs 10[1] to 10[MA] are serially connected together to form a first scan chain in which the MSFFs 10[1] to 10[MA] function as a first shift register, the MSFFs 30[1] to 30[MB] are serially connected together to form a second scan chain in which the MSFFs 30[1] to 30[MB] function as a second shift register, and what is called a scan test is conducted using the first and second scan chains.

Figure 14:
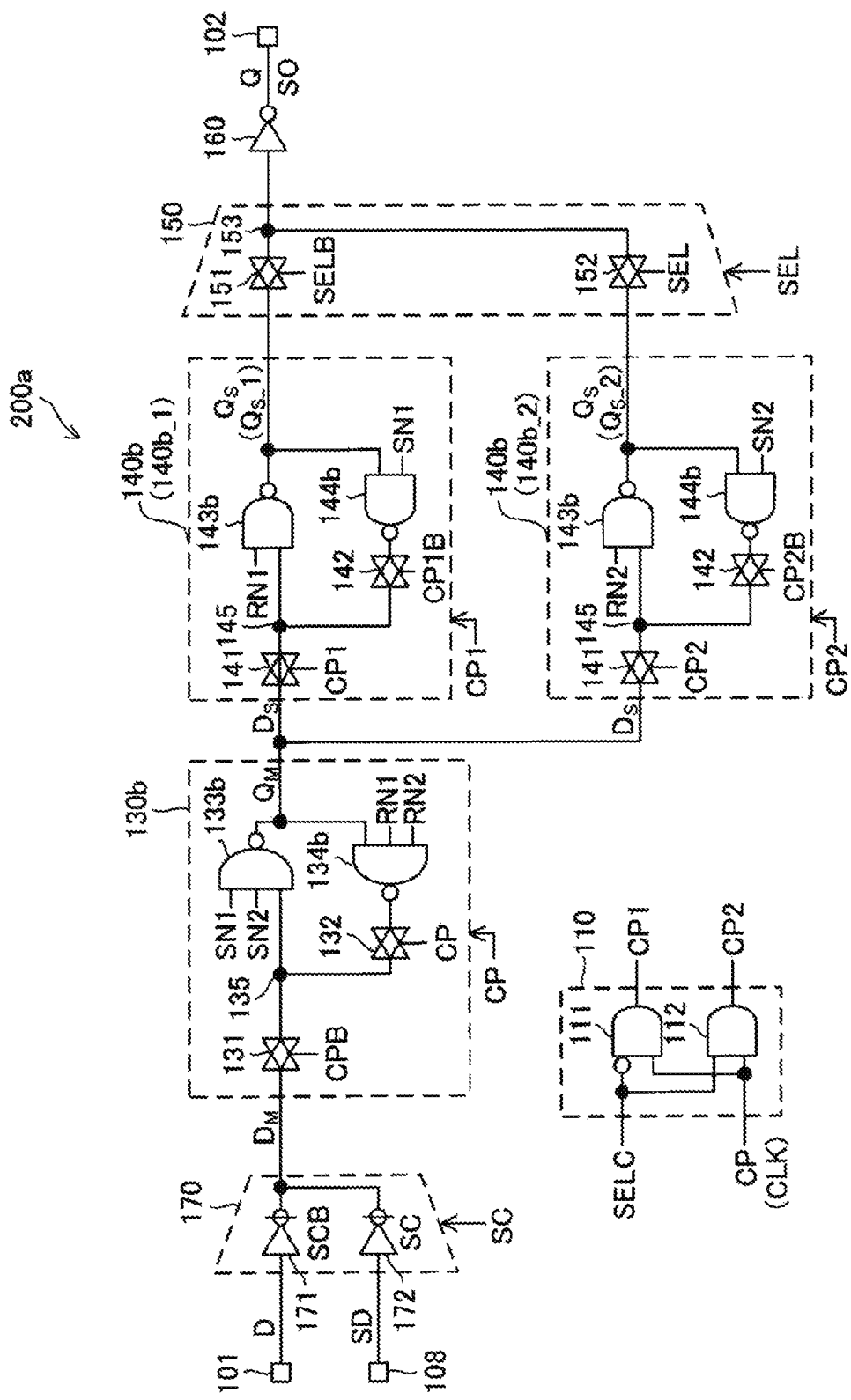
FIG. 14 is a configuration diagram of the multi-slave flip flop circuit according to the second embodiment of the present disclosure.

FIG. 14 illustrates an internal configuration diagram of an MSFF 200a that is an example of the MSFF 200. In the second embodiment, it is assumed that the MSFFs 10 and 30 are each configured as the MSFF 200a. With reference to the MSFF 100b in FIG. 9, the MSFF 200a is obtained by replacing the inverter circuit 120 with the input selection circuit 170. The MSFF 200a in FIG. 14 is similar to the MSFF 100b in FIG. 9 except for the replacement. Only differences attributed to the replacement will be described, with description of similar portions omitted.

The input selection circuit 170 is connected to the data input section 101 and the scan input section 108, and connects, on the basis of the input selection signal SC, either one of the data input section 101 and the scan input section 108 to the input end of the master latch circuit 130b. The input selection signal SC is a 1-bit digital signal and takes the high or low signal level. Specifically, the input selection circuit 170 includes inverter type tristate buffers 171 and 172. The state of the tristate buffer 171 is controlled on the basis of an inversion signal SCB of the input selection signal SC, and the state of the tristate buffer 172 is controlled on the basis of the input selection signal SC. When the input selection signal SC is at the high level, the input selection circuit 170 feeds an inversion signal of a signal indicating the scan input data SD applied to the scan input section 108, to the master latch circuit 130b through the tristate buffer 172 as the signal indicating the master input data DM. On the other hand, when the input selection signal SC is at the low level, the input selection circuit 170 feeds an inversion signal of a signal indicating the input data D applied to the data input section 101, to the master latch circuit 130b through the tristate buffer 171 as the signal indicating the master input data DM.

In the MSFF 200a, configurations and operations of the control signal generation circuit 110, the master latch circuit 130b, and the succeeding circuit of the master latch circuit 130b are similar to the configurations and operations of the same components in the MSFF 100b in FIG. 9. However, in the MSFF 200a, the output signal from the inverter circuit 160 functions as the signal indicating the output data Q and also function as a signal indicating the scan output data SO. The inverter circuit 160 may include two inverter circuits, and in this case, the signal indicating the output data Q and the signal indicating the scan output data SO may be separately output from the two respective inverter circuits.

In the test mode, under the control of the timing control circuit 6, which is also referred to as a test control circuit, the state control circuit 3 (see FIG. 12) can feed the clock selection signal SELC, input selection signal SC, and output selection signal SEL of the high level to each MSFF 10 or 30 configured as the MSFF 200a. Thus, the above-described first and second scan chains are formed, and in each MSFF 10 or 30 having received the signals SELC, SC, and SEL of the high level, the scan input data SD sequentially fed is sequentially latched by the slave latch circuit 140b_2, and the slave output data QS_2 based on the scan input data SD is sequentially output through the output selection circuit 150 and the inverter circuit 160 as the scan output data SO.

Operations in the test mode will be described. In the test mode, the state control circuit 3 cooperates with the digital processing circuit 2a to perform a series of test operations including a scan-in operation, a capture operation, and a scan-out operation. In the test operation, the scan-in operation, the capture operation, and the scan-out operation are performed in this order. First, on the assumption that the test operation is continuously performed, the scan-in operation, the capture operation, and the scan-out operation will be described.

The scan-in operation is an operation for causing the MSFFs 10[1] to 10[MA] to latch predetermined test pattern data (first shift operation). The test pattern data is effective for diagnosing the presence of a failure in the logic circuit 20 and is generated by the state control circuit 3 including the test pattern generation circuit. During the interval when the scan-in operation is performed, the signals SELC, SC, and SEL of the high level are fed to at least the MSFFs 10[1] to 10[MA] included in the MSFFs 10[1] to 10[MA] and 30[1] to 30[MB]. Feeding of the signals SC and SEL of the high level to the MSFFs 10[1] to 10[MA] causes the MSFFs 10[1] to 10[MA] to be connected serially together to form a first scan chain.

Furthermore, in the scan-in operation, an operation is repeated in which data included in test pattern data is fed from the state control circuit 3 to the MSFF 10[1] on a per bit basis as the scan input data SD. At this time, the clock selection signal SELC set at the high level causes the first scan chain (that is, a total of MA slave latch circuits 140*b*_2 in the MSFFs 10[1] to 10[MA]) to perform a data shift operation. As a result, at a completion step of the scan-in operation, the test pattern data is latched by the total of MA slave latch circuits 140*b*_2 in the MSFFs 10[1] to 10[MA].

In the capture operation, the test pattern data latched by the slave latch circuits 140*b*_2 in the MSFFs 10[1] to 10[MA] is fed to the logic circuit 20 as the output data QA[1] to QA[MA]. This causes the data DB[1] to DB[MB] output from the logic circuit 20 to be latched by the slave latch circuits 140*b*_2 in the MSFFs 30[1] to 30[MB].

To achieve this, the state control circuit 3 controls, in the capture operation, the levels of the signals SELC and SC to the MSFFs 30[1] to 30[MB]. Specifically, at the timing when the data DB[1] to DB[MB] based on the test pattern data are output from the logic circuit 20, the signal SC to the MSFFs 30[1] to 30[MB] is set to the low level, and thus the data DB[1] to DB[MB] based on the test pattern data are used as the master input data DM to the MSFFs 30[1] to 30[MB]. During the capture operation, the signal SELC is at the high level. At least at the timing when the data DB[1] to DB[MB] based on the test pattern data correspond to the master output data QM from the MSFFs 30[1] to 30[MB], the signal SELC to the MSFFs 30[1] to 30[MB] is set to the high level. Thus, an up edge occurs in the control signal CP2 in synchronization with an up edge in the clock signal CP occurring while the signal SELC is at the high level, with the result that the data DB[1] to DB[MB] based on the test pattern data are latched by the slave latch circuits 140*b*_2 in the MSFFs 30[1] to 30[MB]. In the capture operation, the output selection signal SEL to the MSFFs 30[1] to 30[MB] may be at the high level or at the low level.

The scan-out operation is an operation for drawing, into the response compression circuit 8*a*, the data DB[1] to DB[MB] based on the test pattern data and latched by the slave latch circuits 140*b*_2 in the MSFFs 30[1] to 30[MB] (second shift operation). During the interval when the scan-out operation is performed, the signals SELC, SC, and SEL of the high level are fed to at least the MSFFs 30[1] to 30[MB] included in the MSFFs 10[1] to 10[MA] and 30[1] to 30[MB]. By feeding the signals SC and SEL of the high level to the MSFFs 30[1] to 30[MB], the MSFFs 30[1] to 30[MB] are serially connected together to form a second scan chain. With the signal SELC set at the high level, in the scan-out operation, the data DB[1] to DB[MB] based on the test pattern data and latched by the slave latch circuits 140*b*_2 in the MSFFs 30[1] to 30[MB] are output from the MSFF 30[MB] to the response compression circuit 8*a* on a per bit basis.

The data DB[1] to DB[MB] based on the test pattern data are hereinafter referred to as test result data of MB bits. The response compression circuit 8*a* performs predetermined compression processing to compress the test result data of MB bits obtained by the scan-out operation to convert the test result data into test result data of MB' bits. MB' has a predetermined value smaller than the value of MB. The result comparison circuit 8*b* compares predetermined expected data with the test result data of MB' bits obtained by the response compression circuit 8*a* to determine whether or not there is a failure in the logic circuit 20.

Additionally, during the interval when the scan-out operation is performed, the signals SELC, SC, and SEL of the high level may be fed to the MSFFs 10[1] to 10[MA]. Thus, the data latched by the slave latch circuits 140*b*_2 in the MSFFs 10[1] to 10[MA] during the execution interval of the scan-in operation (the data ideally match the test pattern data) are fed from the MSFF 10[MA] to the response compression circuit 8*a* during the execution interval of the scan-out operation. The data fed in this case (that is, the data latched by the slave latch circuits 140*b*_2 in the MSFFs 10[1] to 10[MA] during the execution interval of the scan-in operation) are also compressed by the response compression circuit 8*a*, and on the basis of the compressed data, the result comparison circuit 8*b* can determine whether or not there is a failure in the MSFFs 10[1] to 10[MA]. Note that the timing control circuit 6 has fed the state control circuit 3 and the response compression circuit 8*a* with a test control signal specifying timings for operations in the test mode and that the response compression circuit 8*a* references the test control signal to recognize data to be compressed.

Operations in the normal mode will be described. In the normal mode, under the control of the timing control circuit 6, the state control circuit 3 (see FIG. 12) feeds the clock selection signal SELC of the low level and the input selection signal SC and the output selection signal SEL of the low level to the MSFFs 10 and MSFF 30 each configured as the MSFF 200*a*. Thus, in each of the MSFFs 10 and 30 in the normal mode, the input data D sequentially fed is sequentially latched by the slave latch circuit 140*b*_1, and the slave output data QS_1 based on the input data D is sequentially output as the output data Q. In the normal mode, neither of the first and second scan chains is formed, and each MSFF operates as an independent flip flop circuit.

A method is well known in which a scan test can be implemented in the digital processing circuit by replacing the flip flop circuits in the digital processing circuit with flip flop circuits each with a scan function. In a general digital processing circuit that can execute a scan test, once the operation in the test mode is started, the operation in the normal mode (hereinafter referred to as the normal operation) fails to be performed until the series of operations in the test mode is completed. This leads to a situation in which the scan test fails to be applied to applications prevented from stopping the normal operation for time for a failure diagnosis (for example, applications for communication control systems) (this situation is hereinafter referred to as a first situation). Additionally, performing the operation in the test mode discards the current latched data in the circuit, and thus after the operation in the test mode is completed, the normal operation needs to be started in an initial state. In other words, in a general digital processing circuit that can execute a scan test, the normal operation is reset each time the operation in the test mode is performed (this is hereinafter referred to as a second situation).

In contrast, in the data processing apparatus 1*a* according to the present embodiment, problems related to the first and second situations can be solved by utilizing the MSFF 200*a* in FIG. 14. This is because the MSFF 200*a* functioning as a flip flop circuit with a scan function includes the slave latch circuit 140*b*_1 for latching data in the normal mode and a separate slave latch circuit 140*b*_2 for latching data in the test mode.

For example, a case is assumed in which normal operation intervals and pause intervals alternately appear; in the normal operation interval, the normal operation (operation in the normal mode) is continuously performed for a time T1, and in the pause interval, the normal operation is unnecessary for a time T2. In this case, the test operation (the series of operations in the test mode) can be divided into Q portions, and the entire test operation can be performed over Q pause intervals. This solves the problem related to the first situation. Information indicating timings for the pause intervals is recognized or managed by the timing control circuit 6. Under the control of the timing control circuit 6 based on this information, the state control circuit 3 performs level control for the signals SELC, SC, and SEL and output control for the data SD. At this time, the data DA[1] to DA[MA] for implementing the normal operation are latched (held) by the slave latch circuits 140*b*_1 in the MSFFs 10[1] to 10[MA], and the data DB[1] to DB[MB] based on the data DA[1] to DA[MA] are latched (held) by the slave latch circuits 140*b*_1 in the MSFFs 30[1] to 30[MB]. The latched data are continuously latched by the slave latch circuits 140*b*_1 during the execution of the operation in the scan mode, thus solving the problem related to the second situation.

The normal operation and the test operation can be switched for execution at each period of the clock signal CLK. An operation example in this case is similar to the operation example illustrated in FIG. 6, and in this case, the signal SC may be at the high level during the intervals P3, P4, P7, P8, P11, P12, P15, and P16 and may be at the low level during the intervals P1, P2, P5, P6, P9, P10, P13, and P14. In this case, the data A1 to A4 correspond to the input data D fed to the data input section 101, and the data B1 to B4 correspond to the scan input data SD fed to the scan input section 108.

Note that FIG. 14 illustrates a configuration that allows for input of the set signals (SN1 and SN2) and the reset signals (RN1 and RN2) but that, in the MSFF 200*a*, the input of these signals may be disabled (in this case, it is sufficient to assume that the signals SN1, SN2, RN1, and RN2 are all fixed to the high level).

Additionally, a modification is possible in which the data output section 102 in the MSFF 10[MA] is connected to the scan input section 108 in the MSFF 30[1]. In this case, the test operation can be performed using a single scan chain (single shift register) including the MSFFs 10[1] to 10[MA] and 30[1] to 30[MB].

Additionally, the MSFF 200*a* may include three or more slave latch circuits 140*b*. In this case, one of the three or more slave latch circuits 140*b* can be used for latching data in the test mode, and the remaining two or more slave latch circuits 140*b* can be used for latching data in the normal mode.

Third Embodiment

A third embodiment of the present disclosure will be described. In the third embodiment, supplements, applied techniques, modified techniques, and the like for the first and second embodiments will be described.

The control signal generation circuit illustrated by the control signal generation circuit 110 or 110*c* (see FIG. 3 or FIG. 10) may be shared by a plurality of MSFFs instead of being built into each MSFF.

Specifically, for example, the digital processing circuit 2 or 2*a* (see FIG. 1 or FIG. 12) may include a first and a second shared control signal generation circuits.

Each of the first and second shared control signal generation circuits is the same as the control signal generation circuit 110 in FIG. 3. Control signals CP1 and CP2 generated by the first shared control signal generation circuit on the basis of the signals SELC and CP may be provided in common to the MSFFs 10[1] to 10[MA] each configured as the MSFF 100*a*, 100*b*, or 200*a* (see FIG. 3, FIG. 9, or FIG. 14). Control signals CP1 and CP2 generated by the second shared control signal generation circuit on the basis of the signals SELC and CP may be provided in common to the MSFFs 30[1] to 30[MB] each configured as the MSFF 100*a*, 100*b*, or 200*a* (see FIG. 3, FIG. 9, or FIG. 14).

Alternatively, each of the first and second shared control signal generation circuits may be the same as the control signal generation circuit 110*c* in FIG. 10. In this case, control signals CP1 to CP4 generated by the first shared control signal generation circuit on the basis of the signals SELC1, SELC2, and CP may be provided in common to the MSFFs 10[1] to 10[MA] each configured as the MSFF 100*c* (see FIG. 10). Control signals CP1 to CP4 generated by the second shared control signal generation circuit on the basis of the signals SELC1, SELC2, and CP may be provided in common to the MSFFs 30[1] to 30[MB] each configured as the MSFF 100*c* (see FIG. 10).

Additionally, for example, the digital processing circuit 2 or 2*a* (see FIG. 1 or FIG. 12) may include a single shared control signal generation circuit.

In this case, the single shared control signal generation circuit may be the same as the control signal generation circuit 110 in FIG. 3. Control signals CP1 and CP2 generated by the single shared control signal generation circuit on the basis of the signals SELC and CP may be provided in common to the MSFFs 10[1] to 10[MA] and 30[1] to 30[MB] each configured as the MSFF 100*a*, 100*b*, or 200*a* (see FIG. 3, FIG. 9, or FIG. 14).

Alternatively, the single shared control signal generation circuit may be the same as the control signal generation circuit 110*c* in FIG. 10. In this case, control signals CP1 to CP4 generated by the single shared control signal generation circuit on the basis of the signals SELC1, SELC2, and CP may be provided in common to the MSFFs 10[1] to 10[MA] and 30[1] to 30[MB] each configured as the MSFF 100*c* (see FIG. 10).

The values of MA and MB are each assumed to be 2 or larger, but either one of MA and Mb may be "1" or "MA=MB=1" may be set.

The one logic circuit 20 in the digital processing circuit 2 or 2*a* has been focused on for simplification of description. However, the digital processing circuit 2 or 2*a* may contain a plurality of logic circuits including combinational circuits, and a plurality of flip flop circuits may precede and succeed each of the logic circuits. Each of the flip flop circuits can be configured as an MSFF. In a case where the plurality of logic circuits include a first and a second logic circuits and the first logic circuit corresponds to the logic circuit 20, the second logic circuit 20 executes signal processing based on the output data QB[1] to QB[MB] from the MSFFs 30[1] to 30[MB], and a plurality of MSFFs for receiving and holding output data from the second logic circuit are disposed to succeed the second logic circuit.

The data processing apparatus 1 or 1*a* may be formed as a semiconductor integrated circuit, and a semiconductor apparatus may be configured by sealing the semiconductor integrated circuit into a housing (package). The semiconductor apparatus may be, for example, a CPU, or a power supply IC for configuring a power supply circuit, a motor driver IC for driving a motor, or a LED driver IC for driving a light emitting diode (LED).

A semiconductor apparatus including the data processing apparatus 1 or 1*a* can be mounted in optional equipment and is utilized for an optional purpose. For example, the semiconductor apparatus can be mounted in a vehicle such as an automobile. In-vehicle applications often require real-time failure diagnoses, and in this regard, the technique illustrated in the second embodiment is beneficial.

A flip flop circuit W (see, for example, FIG. 3) according to an aspect of the present disclosure includes a master latch circuit (for example, 130) receiving master input data (DM) based on target input data, and a slave latch circuit (for example, 140) that can load master output data from the master latch circuit and hold the master output data, and a data output section (102), and target output data based on the target input data is output from the data output section. The slave latch circuit includes a first to an N-th slave latch circuits (for example, 140_1 and 140_2) provided in parallel with the master latch circuit. The flip flop circuit W further includes an output selection circuit (for example, 150) selecting any one of data output from the first to N-th slave latch circuits. Selection data from the output selection circuit is output from the data output section as the target output data.

The flip flop circuit W, for example, enables data for first to N-th signal processing to be latched (held) by the first to N-th slave latch circuits. Only one logic circuit responsible for the first to N-th processing is provided, and when the first signal processing is executed, the first slave latch circuit can be utilized to input the data for the first signal processing to the logic circuit or receive and latch the data for the first signal processing from the logic circuit. Similarly, when the second signal processing is executed, the second slave latch circuit can be utilized to input the data for the second signal processing to the logic circuit or receive and latch the data for the second signal processing from the logic circuit (this also applies to the third to N-th signal processing). In other words, this configuration eliminates a need to prepare N logic circuits having a common configuration for implementing the first to N-th signal processing. As a result, the circuit area of the apparatus is reduced.

Here, N is an integer of 2 or larger. For example, in the MSFF 100a in FIG. 3, "N=2," and in the MSFF 100c in FIG. 10, "N=4." However, N is any number as long as N is an integer of 2 or larger. The flip flop circuit W corresponds to one of the above-described MSFFs.

In the first embodiment (see FIG. 1 and FIG. 3), the target input data corresponds to the input data D, and the target output data corresponds to the output data Q. On the other hand, in the second embodiment (see FIGS. 12 to 14 and the like), the target input data corresponds to the input data D or the scan input data SD, and the target output data corresponds to the output data Q or the scan output data SO.

The flip flop circuit W (see, for example, FIG. 2 and FIG. 3) may include a clock signal input section (103) receiving an input of a clock signal (CLK=CP) including a rectangular wave signal, a clock selection signal input section (104) receiving an input of a clock selection signal (SELC), an output selection signal input section (105) receiving an input of an output selection signal (SEL), and a control signal generation circuit (for example, 110) generating a first to an N-th control signals on the basis of the clock signal and the clock selection signal. The master latch circuit may operate in synchronization with the clock signal, an i-th slave latch circuit may operate in synchronization with an i-th control signal (i is an integer of 1 or larger and N or smaller), and the output selection circuit may select one of output data from the first to N-th slave latch circuits (for example, 140_1 and 140_2) on the basis of the output selection signal (SEL).

For example, in the example in FIG. 3, the first to N-th control signals correspond to the control signals CP1 and CP2, and in the example in FIG. 10, the first to N-th control signals correspond to the control signals CP1 to CP4.

In the flip flop circuit W (see FIG. 14), for example, the target input data can include first and second target input data (D and SD), and the flip flop circuit W can further include an input selection circuit (170) feeding one of the first and second target input data to the master latch circuit as the master input data.

Various changes can appropriately be made to the embodiments of the present disclosure within the scope of the technical thoughts recited in claims. The above-described embodiments are merely examples of the embodiments of the present disclosure, and the significances of terms for the present disclosure or the components are not limited to the significances described in the above-described embodiments. The specific numerical values illustrated in the above description are only illustrative and can of course be changed to various numerical values.

The present disclosure contains subject matter related to that disclosed in Japanese Priority Patent Application JP 2019-065957 filed in the Japan Patent Office on Mar. 29, 2019, the entire content of which is hereby incorporated by reference.

What is claimed is:

1. A flip flop circuit, comprising:
   a master latch circuit that comprises:
      a master output circuit configured to output master output data corresponding to master input data; and
      a master feedback circuit configured to feedback the master output data to an input side of the master output circuit, wherein
      the master latch circuit is configured to:
         receive the master input data based on target input data, and
         one of load or hold the master input data in response to a predetermined level change in a clock signal,
      the master latch circuit takes a master through state based on a first level of the clock signal,
      in the master through state, the master latch circuit is further configured to generate the master output data on a basis of the master input data and first to N-th set signals, without the master output data from the master feedback circuit, N being an integer of 2 or larger,
      the master latch circuit further takes a master hold state based on a second level of the clock signal different from the first level of the clock signal, and
      in the master hold state, the master latch circuit is further configured to generate the master output data on a basis of the feedback master output data from the master feedback circuit regardless of the master input data;
   a slave latch circuit configured to one of load the master output data from the master latch circuit or hold the master output data;
   a data output section, wherein
      target output data, based on the target input data, is output from the data output section,
      the slave latch circuit includes first to N-th slave latch circuits,
      the first to N-th slave latch circuits are connected in parallel with each other,
      each slave latch circuit of the first to N-th slave latch circuits includes:
         a slave output circuit configured to:
            receive slave input data based on the master output data; and
            output slave output data corresponding to the slave input data; and a slave feedback circuit configured to feedback the slave output data to an input side of the slave output circuit, an i-th slave latch circuit of the first to N-th slave latch circuits takes a slave through state based on a first level of an i-th control signal of first to N-th control signals, i being an integer of 1 or larger and N or smaller, in the slave through state, the i-th slave latch circuit is configured to generate the slave output data on a basis of the slave input data and an i-th reset signal of first to N-th reset signals, without the slave output data from the slave feedback circuit; and an output selection circuit configured to select data output from one of the first to N-th slave latch circuits, wherein the selected data from the output selection circuit is output from the data output section as the target output data.

2. The flip flop circuit according to claim 1, further comprising:

a clock signal input section configured to receive an input of the clock signal including a rectangular wave signal;

a clock selection signal input section configured to receive an input of a clock selection signal;

an output selection signal input section configured to receive an input of an output selection signal; and a control signal generation circuit configured to generate the first to N-th control signals on a basis of the clock signal and the clock selection signal, wherein the master latch circuit is further configured to operate in synchronization with the clock signal, the output selection circuit is further configured to select one of the data output from the first to N-th slave latch circuits on a basis of the output selection signal.

3. The flip flop circuit according to claim 2, wherein on a basis of the clock selection signal, the control signal generation circuit is further configured to:

use any one of the first to N-th control signals as a specific control signal having a signal level varying in synchronization with the clock signal; and fix, to a predetermined level, a level of non-specific control signals corresponding to control signals of the first to N-th control signals other than the specific control signal.

4. The flip flop circuit according to claim 3, wherein the master latch circuit is further configured to output the held master input data, to each slave latch circuit of the first to N-th slave latch circuits, as the master output data, a specific slave latch circuit, included in the first to N-th slave latch circuits and corresponding to the specific control signal, configured to one of load or hold the master output data in response to a predetermined level change in the specific control signal, non-specific slave latch circuits, included in the first to N-th slave latch circuits and, corresponding to the non-specific control signals are configured to keep data held by the non-specific slave latch circuits unchanged, and each of the first to N-th slave latch circuits is configured to output the data held by the slave latch circuit to the output selection circuit.

5. The flip flop circuit according to claim 1, further comprising:

a set signal input section configured to receive inputs of the first to N-th set signals.

6. The flip flop circuit according to claim 1, further comprising:

a reset signal input section configured to receive inputs of the first to N-th reset signals.

7. The flip flop circuit according to claim 1, wherein the target input data includes first target input data and second target input data, and the flip flop circuit further includes an input selection circuit configured to feed one of the first target input data or the second target input data, to the master latch circuit, as the master input data.

8. A data processing apparatus, comprising:

a flip flop circuit that comprises:

a master latch circuit that comprises:

a master output circuit configured to output master output data corresponding to master input data; and a master feedback circuit configured to feedback the master output data to an input side of the master output circuit, wherein the master latch circuit is configured to:

receive the master input data based on target input data, and one of load or hold the master input data in response to a predetermined level change in a clock signal, the master latch circuit takes a master through state, based on a first level of the clock signal, in the master through state, the master latch circuit is further configured to generate the master output data on a basis of the master input data and first to N-th set signals, without the master output data from the master feedback circuit, N being an integer of 2 or larger, the master latch circuit further takes a master hold state based on a second level of the clock signal different from the first level of the clock signal, and in the master hold state, the master latch circuit is further configured to generate the master output data on a basis of the feedback master output data from the master feedback circuit regardless of the master input data;

a slave latch circuit configured to one of load the master output data from the master latch circuit or hold the master output data;

a data output section, wherein target output data, based on the target input data, is output from the data output section, the slave latch circuit includes first to N-th slave latch circuits, the first to N-th slave latch circuits are connected in parallel with each other, each slave latch circuit of the first to N-th slave latch circuits includes:

a slave output circuit configured to:

receive slave input data based on the master output data; and output slave output data corresponding to the slave input data; and a slave feedback circuit configured to feedback the slave output data to an input side of the slave output circuit, an i-th slave latch circuit of the first to N-th slave latch circuits takes a slave through state based on a first level of an i-th control signal of first to N-th control signals, i being an integer of 1 or larger and N or smaller, in the slave through state, the i-th slave latch circuit is configured to generate the slave output data on a basis of the slave input data and an i-th reset signal of first to N-th reset signals, without the slave output data from the slave feedback circuit; and an output selection circuit configured to select data output from one of the first to N-th slave latch circuits, wherein the selected data from the output selection circuit is output from the data output section as the target output data;

a data input circuit configured to feed the target input data to the flip flop circuit; and a logic circuit configured to operate on a basis of the target output data output from the data output section of the flip flop circuit.

9. A data processing apparatus, comprising:
a flip flop circuit that comprises:
  a master latch circuit that comprises:
    a master output circuit configured to output master output data corresponding to master input data; and
    a master feedback circuit configured to feedback the master output data to an input side of the master output circuit, wherein
    the master latch circuit is configured to:
      receive the master input data based on target input data, and
      one of load or hold the master input data in response to a predetermined level change in a clock signal,
    the master latch circuit takes a master through state, based on a first level of the clock signal,
    in the master through state, the master latch circuit is further configured to generate the master output data on a basis of the master input data and first to N-th set signals, without the master output data from the master feedback circuit, N being an integer of 2 or larger,
    the master latch circuit further takes a master hold state based on a second level of the clock signal different from the first level of the clock signal, and
    in the master hold state, the master latch circuit is further configured to generate the master output data on a basis of the feedback master output data from the master feedback circuit regardless of the master input data;
  a slave latch circuit configured to one of load the master output data from the master latch circuit or hold the master output data;
  a data output section, wherein
    target output data, based on the target input data, is output from the data output section,
    the slave latch circuit includes first to N-th slave latch circuits,
    the first to N-th slave latch circuits are connected in parallel with each other,
    each slave latch circuit of the first to N-th slave latch circuits includes:
      a slave output circuit configured to:
        receive slave input data based on the master output data; and
        output slave output data corresponding to the slave input data; and
      a slave feedback circuit configured to feedback the slave output data to an input side of the slave output circuit,
    an i-th slave latch circuit of the first to N-th slave latch circuits takes a slave through state based on a first level of an i-th control signal of first to N-th control signals, i being an integer of 1 or larger and N or smaller,
    in the slave through state, the i-th slave latch circuit is configured to generate the slave output data on a basis of the slave input data and an i-th reset signal of first to N-th reset signals, without the slave output data from the slave feedback circuit;
  an output selection circuit configured to select data output from one of the first to N-th slave latch circuits, wherein the selected data from the output selection circuit is output from the data output section as the target output data;
  a clock signal input section configured to receive an input of the clock signal including a rectangular wave signal;
  a clock selection signal input section configured to receive an input of a clock selection signal;
  an output selection signal input section configured to receive an input of an output selection signal; and
  a control signal generation circuit configured to generate the first to N-th control signals on a basis of the clock signal and the clock selection signal, wherein
    the master latch circuit is further configured to operate in synchronization with the clock signal,
    the output selection circuit is further configured to select one of the data output from the first to N-th slave latch circuits on a basis of the output selection signal;
a data input circuit configured to feed the target input data to the flip flop circuit;
a control circuit configured to feed the clock selection signal and the output selection signal to the flip flop circuit; and
a logic circuit configured to operate on a basis of the target output data output from the data output section of the flip flop circuit.

10. The data processing apparatus according to claim 9, wherein
the control circuit is further configured to feed the clock selection signal and the output selection signal to the flip flop circuit, such that the master input data at different first to N-th timings are respectively loaded and held by each of the first to N-th slave latch circuits, and
the master input data held by the first to N-th slave latch circuits are output from the data output section at different timings.

* * * * *